(12) United States Patent
Napadensky

(10) Patent No.: US 8,784,723 B2
(45) Date of Patent: Jul. 22, 2014

(54) METHOD AND SYSTEM FOR THREE-DIMENSIONAL FABRICATION

(75) Inventor: Eduardo Napadensky, Natania (IL)

(73) Assignee: Stratasys Ltd., Rechovot (IL)

( * ) Notice: Subject to any disclaimer, the term of this patent is extended or adjusted under 35 U.S.C. 154(b) by 426 days.

(21) Appl. No.: 12/593,970

(22) PCT Filed: Apr. 1, 2007

(86) PCT No.: PCT/IL2007/000429
§ 371 (c)(1),
(2), (4) Date: Sep. 30, 2009

(87) PCT Pub. No.: WO2008/120183
PCT Pub. Date: Oct. 9, 2008

(65) Prior Publication Data
US 2010/0121476 A1 May 13, 2010

(51) Int. Cl.
*B29C 41/02* (2006.01)
*B29C 67/00* (2006.01)

(52) U.S. Cl.
CPC .................................. *B29C 67/0051* (2013.01)
USPC .......................................... 264/497; 264/401

(58) Field of Classification Search
CPC .................................................... B29C 67/0051
USPC .................................. 700/119; 264/497, 401
See application file for complete search history.

(56) References Cited

U.S. PATENT DOCUMENTS

| | | | |
|---|---|---|---|
| 4,433,917 A | 2/1984 | Mendel et al. | |
| 5,149,548 A | 9/1992 | Yamane et al. | |
| 5,688,464 A * | 11/1997 | Jacobs et al. | 264/401 |
| 6,007,318 A | 12/1999 | Russell et al. | |
| 6,214,279 B1 * | 4/2001 | Yang et al. | 264/482 |
| 6,242,149 B1 | 6/2001 | Maeda | |
| 6,259,962 B1 * | 7/2001 | Gothait | 700/119 |
| 6,533,449 B1 | 3/2003 | Auad | |
| 6,569,373 B2 | 5/2003 | Napadensky | |
| 6,580,334 B2 | 6/2003 | Simbürger et al. | |
| 6,586,494 B2 | 7/2003 | Mejiritski et al. | |
| 6,658,314 B1 | 12/2003 | Gothait | |

(Continued)

FOREIGN PATENT DOCUMENTS

| | | |
|---|---|---|
| DE | 9319561 | 5/1994 |
| WO | WO 2005/113219 | 12/2005 |

(Continued)

OTHER PUBLICATIONS

Response Dated Mar. 11, 2010 to Official Action of Dec. 11, 2009 From the US Patent and Trademark Office Re.: U.S. Appl. No. 12/327,857.

(Continued)

*Primary Examiner* — Galen Hauth

(57) ABSTRACT

A method of three-dimensional fabrication of an object is disclosed. The method comprises: forming a plurality of layers in a configured pattern corresponding to the shape of the three-dimensional object, at least one layer of the plurality of layers being formed at a predetermined and different thickness selected so as to compensate for post-formation shrinkage of the layer along a vertical direction. In various exemplary embodiments of the invention spread of building material of one or more layers is diluted at least locally such as to maintain a predetermined thickness and a predetermined planar resolution for the layer.

14 Claims, 14 Drawing Sheets

(56) References Cited

U.S. PATENT DOCUMENTS

| | | |
|---|---|---|
| 6,782,303 B1 | 8/2004 | Fong |
| 6,850,334 B1 | 2/2005 | Gothait |
| 6,863,859 B2 | 3/2005 | Levy |
| 6,919,385 B2 | 7/2005 | Hayashi |
| 7,183,335 B2 | 2/2007 | Napadensky |
| 7,209,797 B2 | 4/2007 | Kritchman et al. |
| 7,225,045 B2 | 5/2007 | Gothait et al. |
| 7,300,619 B2 | 11/2007 | Napadensky et al. |
| 7,364,686 B2 | 4/2008 | Kritchman et al. |
| 7,500,846 B2 | 3/2009 | Eshed et al. |
| 7,604,768 B2 | 10/2009 | Kritchman |
| 2001/0003004 A1 | 6/2001 | Leyden et al. |
| 2003/0151167 A1* | 8/2003 | Kritchman et al. ........... 264/401 |
| 2004/0207124 A1 | 10/2004 | Kritchman et al. |
| 2005/0104241 A1 | 5/2005 | Kritchman et al. |
| 2005/0142024 A1* | 6/2005 | Herzog ........................ 419/53 |
| 2006/0127153 A1 | 6/2006 | Menchik et al. |
| 2007/0179656 A1 | 8/2007 | Eshed et al. |
| 2008/0146777 A1 | 6/2008 | Sasa |

FOREIGN PATENT DOCUMENTS

| | | |
|---|---|---|
| WO | WO 2006/045002 | 4/2006 |
| WO | WO 2008/120183 | 10/2008 |
| WO | WO 2009/013751 | 1/2009 |

OTHER PUBLICATIONS

Communication Relating to the Results of the Partial International Search Report Dated Jan. 28, 2008 From the International Searching Authority Re.: Application No. PCT/IL2007/000429.

International Preliminary Report on Patentability Dated Oct. 15, 2009 From the International Bureau of WIPO Re.: Application No. PCT/IL2007/000429.

International Search Report Dated Jul. 31, 2008 From the International Searching Authority Re.: PCT/IL2007/000429.

Written Opinion Dated Jul. 31, 2008 From the International Searching Authority Re.: Application No. PCT/IL2007/000429.

Official Action Dated Dec. 11, 2009 From the US Patent and Trademark Office Re.: U.S. Appl. No. 12/327,857.

Official Action Dated May 19, 2010 From the US Patent and Trademark Office Re.: U.S. Appl. No. 12/327,857.

\* cited by examiner

METHOD AND SYSTEM FOR THREE-DIMENSIONAL FABRICATION

RELATED APPLICATIONS

This Application is a National Phase of PCT Patent Application No. PCT/IL2007/000429 having International filing date of Apr. 1, 2007. The contents of the above Application are all incorporated herein by reference.

FIELD AND BACKGROUND OF THE INVENTION

The present invention relates to three-dimensional fabrication and, more particularly, to a method and system for three-dimensional fabrication of objects having enhanced dimensional accuracy.

Three dimensional fabrication processes are defined as processes in which objects are constructed in layers utilizing a computer model of the objects. The layers are deposited or formed by a suitable device which receives signals from a computer using, e.g., a computer aided design (CAD) software.

Three-dimensional fabrication is typically used in design-related fields where it is used for visualization, demonstration and mechanical prototyping. Thus, three-dimensional fabrication facilitates rapid fabrication of functioning prototypes with minimal investment in tooling and labor. Such rapid prototyping shortens the product development cycle and improves the design process by providing rapid and effective feedback to the designer. Three-dimensional fabrication can also be used for rapid fabrication of non-functional parts, e.g., for the purpose of assessing various aspects of a design such as aesthetics, fit, assembly and the like. Additionally, three-dimensional fabrication techniques have been proven to be useful in the fields of medicine, where expected outcomes are modeled prior to performing procedures. It is recognized that many other areas can benefit from rapid prototyping technology, including, without limitation, the fields of architecture, dentistry and plastic surgery where the visualization of a particular design and/or function is useful.

In the past several years, there has been considerable interest in developing computerized three-dimensional fabrication techniques.

One such technique is disclosed, e.g., in U.S. Pat. Nos. 6,259,962, 6,569,373, 6,658,314, 6,850,334, 6,863,859 and 7,183,335, U.S. Patent Application Publications Nos. 20050104241 and 20050069784, and PCT Publ. No. WO/2004/096527, the contents of which are hereby incorporated by reference. In this technique, an interface material is dispensed from a printing head having a set of nozzles to deposit layers on a supporting structure. Depending on the interface material, the layers are then cured using a suitable curing device. The interface material may include build material, which forms the object, and support material, which supports the object as it is being built.

In another such technique, disclosed, e.g., in U.S. Pat. No. 5,204,055, a component is produced by spreading powder in a layer and then depositing a binder material at specific regions of a layer as determined by the computer model of the component. The binder material binds the powder both within the layer and between adjacent layers. In a modification of this approach, the powder is raster-scanned with a high-power laser beam which fuses the powder material together. Areas not hit by the laser beam remain loose and fall from the part upon its removal from the system.

U.S. Pat. No. 6,193,923 to Leyden et al. discloses a selective deposition modeling system which includes a dispensing platform slidably coupled to an X-stage. A multi orifice inkjet head is located on the dispensing platform and configured for jetting hot melt inks onto a part-building platform. The dispensing platform moves back and forth in the X-direction relative to a part-building platform, such that the inkjet head scans the part-building platform while jetting the inks thereon. The head is computer controlled so as to selectively activate its orifices and cause them to simultaneously emit droplets of ink in a configured pattern corresponding to the shape of the object.

Leyden et al. contemplate several building styles, including dispensing higher drop density in down-facing surfaces, up-facing surfaces or boundary regions of the object compared to interior regions of the object; and building down-facing and up-facing skin regions which respectively extend several layers near down-facing and up-facing surfaces.

Another reference of interest is U.S. Published Application No. 20040159978 to Nielsen et al., which discloses a technique for reducing the effects of "terracing" in a three dimensional fabrication processes. The terracing effect leaves noticeable visual traces, typically in objects that have vertically contoured surfaces which spread across multiple layers. To overcome this effect Nielsen et al. vary the amount of binder or build material added across each layer, such that the thickness of the layer is gradually decreased in transition regions between successive terraced layers.

Also of interest is a three-dimensional fabrication technique known as stereolithography, disclosed, e.g., in U.S. Pat. No. 4,575,330. In this technique, a focused ultra-violet (UV) laser scans the top of a bath of a photopolymerizable liquid material. The UV laser causes the bath to polymerize where the laser beam strikes the surface of the bath, resulting in the creation of a solid plastic layer just below the surface. The solid layer is then lowered into the bath and the process is repeated for the generation of the next layer, until a plurality of superimposed layers forming the desired part is obtained.

Even though three-dimensional fabrication is widely practiced and has become a routine process for manufacturing three-dimensional objects, it is not without certain operative limitations that would best be avoided.

For example, in conventional three-dimensional fabrication techniques there is a discrepancy between the designed thickness and the final thickness of the deposited layers. The discrepancy may be the result of various factors, including continuous shrinkage process, incompatibility between the resolution of the layer and its thickness, formation of "dead" areas in the layers and the like. This discrepancy oftentimes leads to a reduction in the accuracy of the final product.

Additionally, many of the presently known three-dimensional fabrication techniques employ a leveling device which ensures that each layer of the object is accurately leveled, but, at the same time, discards excess material from the layer and a considerable amount of waste is produced at each leveling step.

There is thus a widely recognized need to have a method and system for three-dimensional fabrication, devoid of the above limitations.

SUMMARY OF THE INVENTION

The background art does not teach or suggest a method and system for three-dimensional layerwise fabrication in which post-formation shrinkage along a vertical direction, which is not constant over the various layers, is compensated.

The background art does not teach or suggest a method and system for three-dimensional layerwise fabrication in which post-formation shrinkage along one or more horizontal directions, which depends on the time length of layer formation, is compensated.

The background art does not teach or suggest a method and system for three-dimensional layerwise fabrication which overcome problems associated with the planar and/or vertical resolution of the layers.

The background art does not teach or suggest a method and system for three-dimensional layerwise fabrication which overcome problems associated with defective locations on the layers, except of random scatter of nozzles from layer to layer.

Thus, according to one aspect of the present invention there is provided a method for three-dimensional fabrication of an object, by forming a plurality of layers in a configured pattern corresponding to the shape of the three-dimensional object.

According to further features in preferred embodiments of the invention described below, at least one layer is formed at a predetermined and different thickness, relative to other layers, and selected so as to compensate for post-formation shrinkage of the layer along a vertical direction.

According to still further features in the described preferred embodiments at least one layer is rescaled along at least one horizontal direction so as to compensate for post-formation shrinkage of the layer along the at least one horizontal direction.

According to still further features in the described preferred embodiments the formation time of the layer is kept constant for all layers. According to still further features in the described preferred embodiments the constant formation time is achieved by scanning a printing area that is as large as the area of one of the first layers for all the layers.

According to another aspect of the present invention there is provided a system for three-dimensional fabrication of an object. The system comprises a three-dimensional fabrication apparatus, designed and constructed to form a plurality of layers in a configured pattern corresponding to the shape of the three-dimensional object.

According to still further features in the described preferred embodiments the three-dimensional fabrication apparatus has a controller which ensures that (i) at least one layer is formed at a predetermined and different thickness selected so as to compensate for post-formation shrinkage of the layer along a vertical direction, and/or (ii) at least one layer is rescaled along at least one horizontal direction so as to compensate for post-formation shrinkage of the layer along the at least one horizontal direction.

According to still further features in the described preferred embodiments the rescaling along the at least one horizontal direction is a monotonically decreasing function of a formation time of a layer.

According to still further features in the described preferred embodiments the predetermined and different thickness is selected so as to compensate for cumulative post-formation shrinkage of the layer and at least one additional layer below the layer.

According to still further features in the described preferred embodiments the rescaling along the at least one horizontal direction is performed so as to compensate for cumulative post-formation shrinkage of the layer and at least one additional layer below the layer.

According to still further features in the described preferred embodiments the predetermined and different thickness is a function of a vertical position of the layer in the three-dimensional object.

According to still further features in the described preferred embodiments the function of the vertical position comprises at least one exponentially decaying function of the vertical position.

According to still further features in the described preferred embodiments the predetermined and different thickness is a function of a formation time of the layer.

According to still further features in the described preferred embodiments the formation of the layers comprises: selectively dispensing a layer of building material in a pattern manner configuration; curing the layer of the building material; and repeating the step of selectively dispensing and the step of curing a plurality of times.

According to still further features in the described preferred embodiments the object is fabricated on a tray, and the formation of the plurality of layers comprises lowering the tray by a different step size for different layers.

According to still further features in the described preferred embodiments the layers are formed at a predetermined and different thickness but assume the same thickness after the post-formation shrinkage.

According to still further features in the described preferred embodiments the formation of the layers comprises computing layers of different thickness.

According to still further features in the described preferred embodiments the formation of the layers comprises lowering the tray by a constant step size for different layers.

According to still further features in the described preferred embodiments the rescaling is performed on digital data representing the object.

According to still further features in the described preferred embodiments the rescaling is performed according to the formation time of a predetermined layer, which can be, for example, one of the lowest layers of the object.

According to still further features in the described preferred embodiments the rescaling is performed on digital data of the object prior to slicing.

According to still further features in the described preferred embodiments the spread of building material per unit area in the layer is diminished at least locally. According to still further features in the described preferred embodiments the diminishing is done so as to maintain the predetermined thickness and a predetermined planar resolution of the layer.

According to still further features in the described preferred embodiments the spread of building material is diminished at interior regions of the object, the interior regions being characterized by a distance from a closest exterior surface of the object which is above a predetermined threshold distance.

According to still further features in the described preferred embodiments the predetermined threshold distance is dependent on the spatial direction from the interior regions to the exterior surface.

According to still further features in the described preferred embodiments the spread of building material is diluted exclusively at an inner portion of the layer, to provide, for the layer, a central diluted region surrounded by a peripheral non-diluted region.

According to still further features in the described preferred embodiments the spread of building material is diminished such as to reduce amount of excess of building material removed as waste.

According to still further features in the described preferred embodiments the diminishing is obtained by diluting the spread of building droplets.

According to still further features in the described preferred embodiments at least one layer is characterized by a bitmap with respect to a predetermined horizontal reference frame.

According to still further features in the described preferred embodiments bitmaps of adjacent layers are interlaced with respect to the predetermined horizontal reference frame.

According to still further features in the described preferred embodiments bitmaps of every two adjacent layers are defined with respect to different horizontal reference frames.

According to still further features in the described preferred embodiments the formation of the layers is by a stereolithography technique.

According to still further features in the described preferred embodiments the three-dimensional fabrication apparatus comprises a stereolithography apparatus.

According to still further features in the described preferred embodiments the formation of the layers comprises employing a powder binding technique.

According to still further features in the described preferred embodiments the three-dimensional fabrication apparatus comprises a powder binding fabrication apparatus.

According to still further features in the described preferred embodiments the dispensing is by at least one nozzle array. According to still further features in the described preferred embodiments defective nozzles and non-defective nozzles in the nozzle array(s) are detected prior to the formation of the layers, so as to allow compensation of the defective nozzles during the dispensing step.

According to still further features in the described preferred embodiments the dispensing is performed in a manner such that for each k+1 adjacent layers, defective sectors in the lowest layer of the k+1 adjacent layers are overlapped with non-defective sectors in the other k layers of the k+1 adjacent layers.

According to a further aspect of the present invention there is provided a method of three-dimensional printing of an object using a three-dimensional fabrication apparatus having a printing tray and a printing head configured to dispense building material through at least one nozzle array characterized by an array resolution along an axis typically referred to as the Y axis. The method comprises: (a) calculating a bitmap defined with respect to predetermined horizontal reference frame, the bitmap describing at least one layer of the three-dimensional object, and being characterized by a planar resolution along the Y axis which is substantially an integer multiplication of the array resolution; (b) moving the printing head over the printing tray while dispensing the building material according to the bitmap, thereby forming a layer compatible with the bitmap; and (c) repeating the steps (a) and (b) a plurality of times such as to form a plurality of layers, in a manner such that bitmaps of adjacent layers are interlaced along the Y axis with respect to the predetermined horizontal reference frame.

According to a further aspect of the present invention there is provided a method of three-dimensional printing of an object using a three-dimensional fabrication apparatus having a printing tray and a printing head configured to dispense building material through at least one nozzle array characterized by an array resolution along Y axis. The method comprises: (a) calculating a bitmap describing at least one layer of the three-dimensional object; (b) moving the printing head over the printing tray while dispensing the building material according to every i-th row of pixels in X direction of the bitmap, wherein the i is an integer larger than one (e.g., i=2), thereby forming a layer compatible with the bitmap; and (c) repeating the steps (a) and (b) a plurality of times such as to form a plurality of layers, in a manner such that in each layer the dispensed rows of pixels in X direction are interlaced along Y axis in respect to adjacent rows.

According to yet a further aspect of the present invention there is provided a system for three-dimensional printing of an object. The system comprises: a three-dimensional fabrication apparatus having a printing tray and a printing head configured to dispense building material through at least one nozzle array characterized by an array resolution along the Y axis; and a data processor supplemented with an algorithm for calculating a bitmap defined with respect to predetermined horizontal reference frame, the bitmap describing at least one layer of the three-dimensional object, and being characterized by a planar resolution the Y axis which is substantially an integer multiplication of the array resolution; the printing head being operatively associated with a controller designed and constructed to ensure that the printing head repeatedly moves over the printing tray while dispensing the building material according to the bitmap to form a plurality of layers each being compatible with a respective bitmap, wherein bitmaps of adjacent layers are interlaced with respect to the predetermined horizontal reference frame.

According to still a further aspect of the present invention there is provided a system for three-dimensional printing of an object. The system comprises: a three-dimensional fabrication apparatus having a printing tray and a printing head configured to dispense building material through at least one nozzle array characterized by an array resolution; a data processor supplemented with an algorithm for calculating a bitmap defined with respect to predetermined horizontal reference frame, the bitmap describing one layer of the three-dimensional object, and being characterized by a planar resolution which is substantially an integer multiplication of the array resolution; the printing head being operatively associated with a controller designed and constructed to ensure that the printing head repeatedly moves over the printing tray while dispensing the building material according to the bitmap to form a plurality of layers, wherein each layer is compatible with a respective bitmap and bitmaps of any two adjacent layers are defined with respect to different horizontal reference frames.

According to still a further aspect of the present invention there is provided a method of three-dimensional printing of an object using a three-dimensional fabrication apparatus having a printing tray and a printing head configured to dispense building material through at least one nozzle array. The method comprises: detecting defective nozzles in the at least one nozzle array; repeatedly moving the printing head over the printing tray while dispensing the building material to form a plurality of layers, at least one layer of the plurality of layers having defective sectors corresponding to the defective nozzles and non-defective sectors corresponding to non-defective nozzles, the plurality of layers being formed in a configured pattern corresponding to the shape of the three-dimensional object; the repeated moving being performed in a manner such that for each k+1 adjacent layers, defective sectors in the lowest layer of the k+1 adjacent layers are overlapped with non-defective sectors in the other k layers of the k+1 adjacent layers.

According to still a further aspect of the present invention there is provided a system for three-dimensional printing of an object. The method comprises: a three-dimensional fabrication apparatus having a printing tray and a printing head configured to dispense building material through at least one nozzle array, having defective nozzles and non-defective nozzles; wherein the printing head is operatively associated with a controller designed and constructed to ensure that the printing head repeatedly moves over the printing tray while dispensing the building material to form a plurality of layers, at least one layer of the plurality of layers having defective sectors corresponding to the defective nozzles and non-defective sectors corresponding to the non-defective nozzles, the plurality of layers being formed in a configured pattern corresponding to the shape of the three-dimensional object; the controller being further designed and constructed to ensure that for each k+1 adjacent layers, defective sectors in the lowest layer of the k+1 adjacent layers are overlapped with non-defective sectors in the other k layers of the k+1 adjacent layers.

According to further features in preferred embodiments of the invention described below, k equals or is larger than 1.

According to still further features in the described preferred embodiments substantially all the defective sectors in the lowest layer of the k+1 adjacent layers are overlapped with non-defective sectors in the other k layers of the k+1 adjacent layers.

According to still further features in the described preferred embodiments non-defective nozzles dispense an increased amount of the building material on non-defective sectors overlapped with the defective sectors.

According to still further features in the described preferred embodiments the non-defective nozzles are operated with increased voltage while moving above defective sectors.

According to still further features in the described preferred embodiments the non-defective nozzles dispense the building material at an increased planar density while moving above defective sectors.

According to still further features in the described preferred embodiments non-defective nozzles dispense at an increased jetting frequency on non-defective sectors overlapped with the defective sectors.

According to still further features in the described preferred embodiments the method comprises scanning the layers along the X direction, and the overlapping is ensured by shifting the printing head in the Y direction prior to the scan of each layer.

According to still further features in the described preferred embodiments the printing head is operable to scan the layer in the X direction, and the controller is designed and constructed to shift the printing head in the Y direction prior to the scan of each layer, so as to ensure the overlapping.

According to still further features in the described preferred embodiments the shift in the Y direction is selected from a predetermined series of shifts.

According to still further features in the described preferred embodiments the shift in the Y direction is randomly selected from a predetermined series of shifts.

According to still further features in the described preferred embodiments the building material is curable by ultraviolet or visible light.

According to still further features in the described preferred embodiments the building material comprises photopolymer material.

According to still further features in the described preferred embodiments the system further comprises a radiation source for curing the building material following dispensing a layer thereof and prior to dispensing thereon of a succeeding layer of the building material.

According to still further features in the described preferred embodiments the system further comprises a temperature control unit for controlling the temperature in the system.

According to still further features in the described preferred embodiments the system further comprises at least one leveling device for leveling each layer prior to dispensing thereon of a succeeding layer.

According to still further features in the described preferred embodiments the system further comprises a cooling unit for cooling the three-dimensional object and/or three-dimensional fabrication apparatus.

According to still further features in the described preferred embodiments the system further comprises a sensing unit to determine collisions or potential collisions between the printing head and the three-dimensional object.

According to still further features in the described preferred embodiments the system further comprises a sensing unit to determine collisions or potential collisions between the leveling device and the three-dimensional object.

According to still a further aspect of the present invention there is provided a method of preparing a bitmap for three-dimensional printing of an object, the bitmap corresponding to a predetermined resolution and a predetermined thickness of a layer of the object. The method comprises: preparing a preliminary bitmap according to the predetermined resolution; calculating an expected thickness of the layer resulting from the preliminary bitmap; calculating a ratio between the expected thickness and the predetermined thickness of the layer; based on the ratio, applying a dilution transformation to the preliminary bitmap, thereby preparing the bitmap.

According to further features in preferred embodiments of the invention described below, the dilution transformation dilutes the spread of building material at interior regions of the object. The interior regions can be characterized by a distance from a closest exterior surface of the object which is above a predetermined threshold distance.

The present invention successfully addresses the shortcomings of the presently known configurations by providing a method and system for three-dimensional fabrication.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

Figure 1A:
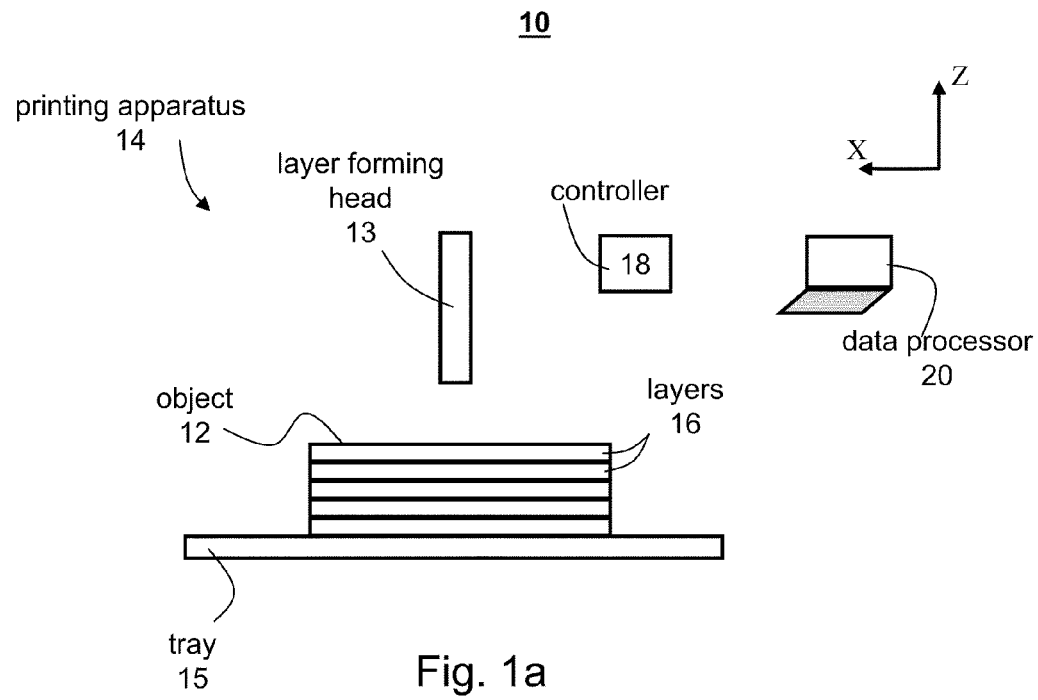
FIGS. 1a-b is a schematic illustration of a system for three-dimensional fabrication of an object, according to various exemplary embodiments of the present invention.

The present embodiments comprise a system and method which can be used for three-dimensional layer-wise printing of an object. The present embodiments can be used to provide three-dimensional objects having enhanced dimensional accuracy. Specifically, the present embodiments can be used to compensate for vertical discrepancies and/or defective sectors in the layers of the object.

The principles and operation of a method and system according to the present embodiments may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The method and system of the present embodiments fabricate three-dimensional objects in a layerwise manner by forming a plurality of layers in a configured pattern corresponding to the shape of object. Each layer is formed by an apparatus which scans a two-dimensional surface and patterns it. While scanning, the apparatus visits a plurality of target locations on the two-dimensional layer or surface, and decides, for each target location or a group of target locations, whether or not the target location or group of target location is to be occupied by building material in the final object. The decision is made according to a computer image of the surface.

Generally, the information for producing the layers of the object can be described in the form of two-dimensional bitmaps of the required spatial resolution in both X and Y directions. The bitmap corresponds to the required printing plot, where each two-dimensional bitmap element (e.g., pixel) corresponds to a target location that should be filled with building material or left empty in the real printing plot. Such bitmap is translated to an operating bitmap, in which each bitmap element corresponds to a target location on the respective layer on which a single smallest-quanta of material is deposited. In the simplest case, the bitmaps store binary information where, for example, "1"s represent locations which are to be occupied by building material in the final object and "0"s represent voids in the final objects.

For example, when an ink-jet head is used for ejecting a building material, "1"s in an operating bitmap can represent locations on which the ink jet head ejects one single droplet per pixel and "0"s represent locations skipped by the ink jet head. On the other hand, "1"s in a non-operating bitmap can represent locations on which the ink jet head ejects one or more droplets per pixel. The bitmap and the operating bitmap can either coincide or they can differ.

More sophisticated bitmaps in which the bitmap elements can store non-binary values (representing, e.g., local amounts of building material) are also contemplated. A target location on a layer which is occupied by building material (corresponding, for example, to a "1" in the respective bitmap element) is referred to herein as an "occupied location" and a location which is to be left unoccupied (corresponding, for example, to a "0" in the respective bitmap element) is referred to as a "void location".

The three-dimensional fabrication apparatus can operate in many ways. For example, referring to the above "1" and "0" binary convention, the apparatus can dispense building material in target locations which correspond to "1"s in the bitmap, and leave voids in target locations which correspond to "0"s in the bitmap. Similarly support material can be dispensed corresponding to "1"s in the support bitmap. In another embodiment, the bitmap may store tertiary information, where building material can be dispensed in target locations corresponding to "2"s in the bitmap and support material in target locations corresponding to "1"s, leaving voids in the target locations corresponding to "0"s in the bitmap.

Once the building and support materials are dispensed they are cured to stabilize the newly formed layer. The supporting matrix, which is often composed primarily of the second type of material reinforced with minute material of the first type (in either continuous form or as discrete elements such as pins and membranes) can be removed (e.g., by washing) once the layer is formed, or, more preferably, after the printing of the object is completed.

In other embodiments, the layer can be made of uniform material and the fabrication apparatus can selectively transform, for example, by bonding, curing or solidifying, the building material according to the bitmap, thus forming on the layer target locations having a first type of material and target locations having a second type of material. The material in the target locations corresponding to "0"s is preferably removable, so as to allow its removal either once the layer is formed or after the fabrication of the object is completed.

The formation of every layer is thus accompanied by a process in which the layer is solidified, bonded or cured, which is typically accomplished in an environment of elevated temperatures. Each layer (except the first) is formed or laid on a previously formed layer.

The present embodiments successfully provide solutions to several problems associated with three-dimensional printing.

One such problem relates to post-formation shrinkage of the layers in Z direction (or decrease of layers' thickness). Due to the gradual reduction in temperature in the lower layers and the continuation of the formation process of the upper layers, there may be continuous Z shrinkage of the layers for a period of time following their formation. The shrinkage of layers has a cumulative impact on the thickness of successive layers, because during the time in which a successive layer is formed, its supporting area may sink.

Post-formation shrinkage occurs in many three-dimensional printing techniques, and reduces the printing accuracy of the final printed object, because in reality the thickness of the layers is lower than the designed thickness. Such discrepancy may also affect the overall dimensions of the printed object. As explained in greater detail hereinunder, the system and method of the present embodiments form each layer of the object at a thickness selected to compensate for the post-formation shrinkage. Two embodiments are presented for such compensation. In a first such embodiment, each Z step of the tray from layer to layer has a different value, which is preferably characterized by a decreasing function of a vertical position of the layer in the object. In a second embodiment, the Z step is maintained constant, while the computation of the layers (object slicing) assumes layers of different thickness, preferably characterized by an increasing function of a vertical position of the layer in the object.

Another problem associated with three-dimensional printing relates to the planar resolution of the layers. The planar resolution of the layers is defined as the number of target locations on the surface of the layer per unit area. When the planar resolution of the layers is not compatible with the type of building material and/or the inherent resolution of the printing apparatus, undesired variations may occur in the thickness of the layers. Specifically, too high a planar resolution may result in formation of a thicker layer than desired and too low a planar resolution may result in formation of a thinner layer than desired. As further detailed hereinunder, the system and method of the present embodiments successfully overcome this problem by judicious bitmap manipulations.

An additional problem, typically associated with types of printing apparatus which dispense building materials through nozzle arrays, relates to the formation of defective locations on the layer. This problem is addressed by the present embodiments by increasing the amount of building material in regions of the subsequent layer which overlap the defective locations, as further detailed hereinafter.

Figure 1B:
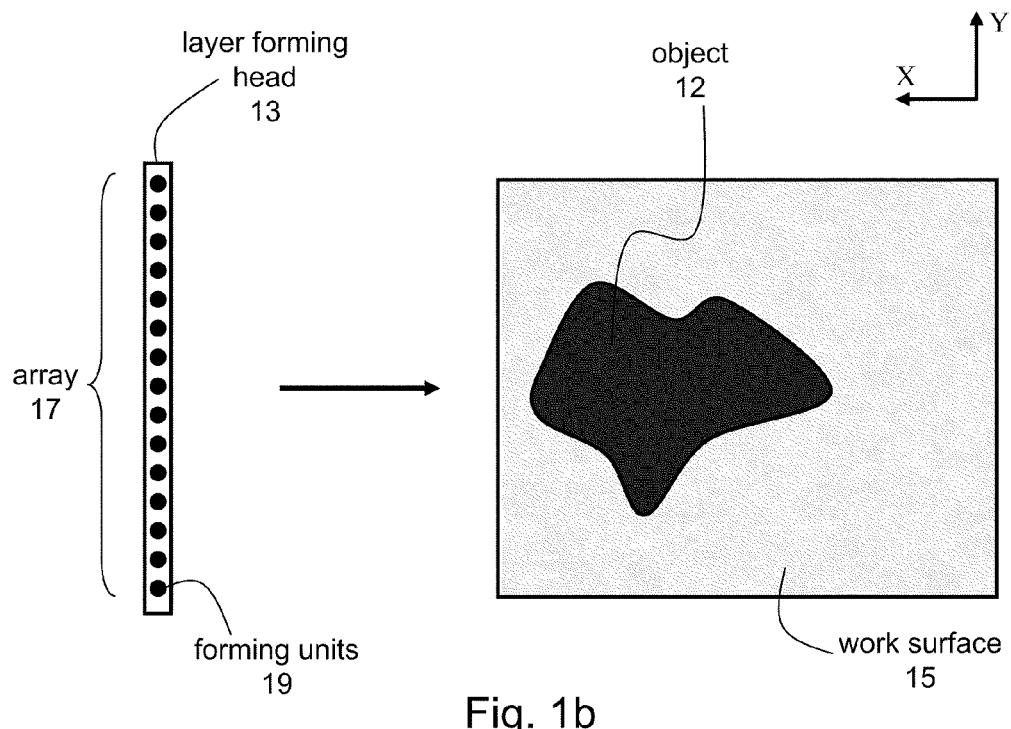

Referring now to the drawings, FIGS. 1a-b illustrate a system 10 for three-dimensional fabrication of an object 12, according to various exemplary embodiments of the present invention. System 10 comprises a printing apparatus 14 which forms a plurality of layers 16 in a configured pattern corresponding to the shape of object 12.

It is to be understood that although the layers illustrated in FIG. 1a are of substantially equal surface area, this need not necessarily be the case, since, for some objects, it may not be necessary for the layers to have equal surface area. An exemplary embodiment in which layers 16 have non-uniform size is described hereinunder (see FIG. 4a and the accompanying description).

In a preferred embodiment, apparatus 14 comprises a layer-forming head 13 for forming layers 16 and a tray 15 which carries layers 16 as they are formed. Head 13 may form layers by any known technique, including, without limitation, ink-jet printing, as further detailed hereinunder. In various exemplary embodiments of the invention head 13 comprises a composite array 17 of forming units 19, such as to allow head 13 to simultaneously address several target locations on the formed layer. As further detailed hereinunder, units 19 can be nozzles or radiation sources, depending on the technique employed for forming the layers. Layer-forming head 13 may comprise a number of separate printing heads, each having an array of forming units 19, but for ease of presentation, a single composite array 17 of forming units 19 is shown in FIG. 1b. According to the common conventions, units 19 are arranged along the Y direction, each layer is formed while performing one or more scans of head 13 along the X direction, and the formed layers are stacked along the Z direction.

Apparatus 14 preferably comprises a controller 18 which controls the operation of apparatus 14 to ensure that the layers are properly formed. Specifically, controller 18 ensures that each layer is formed at a predetermined and optionally different thickness, selected so as to compensate for post-formation shrinkage of the layer along a vertical direction.

As used herein in the specification and the claims section that follows, "post-formation shrinkage" refers to shrinkage of the layer during a time period which begins subsequently to, and immediately after, the formation of the layer, and ends when the changes in the volume of the layer are negligible (preferably less than 0.1%). Such time period is referred to herein as the "post-formation period." When several steps are required for forming the layer the post-formation period begins, in most cases, immediately after all the steps are completed. For example, when the formation of the layer includes dispensing a building material followed by leveling, the post-formation period begins immediately after the leveling step. In some cases, the post-formation period of one layer begins contemporaneously with the beginning of the formation of the subsequent layer.

Representative examples of methods to determine the suitable thicknesses of the layers are provided hereinunder.

Controller 18 may be located either within apparatus 14 or it can communicate externally therewith via wire and/or wireless communication. Controller 18 preferably comprises, or operates in combination with, a data processor 20 which transmits building instructions to controller 18, based on, for example, a predetermined CAD configuration which may be converted, for example, to a Solid Triangulated Language (STL) or a Slice (SLC) format used by the data processor.

Supporting software in processor 20 use computer object data representing the desired dimensional configuration of object 12 and transmits building instructions to be executed by controller 18. Specifically, a suitable algorithm in the supporting software creates the geometry of the object, and slices the geometry into the desired number of layers. Each layer is preferably described in a form of bitmaps as further detailed hereinabove.

Apparatus 14 typically comprises motion devices which are responsive to signals transmitted by controller 18. These motion devices operate to establish relative translational motions between the layer-forming head and tray 15 or the upper surface of the object (also referred to as "work surface"), both in the plane of tray 15 or the work surface (conventionally defined as the X-Y plane, see, e.g., FIG. 1*b*), and in the vertical direction (conventionally defined as the Z direction, see, e.g., FIG. 1*a*). Apparatus 14 can be any three-dimensional fabrication apparatus known in the art, including, without limitation stereolithography, powder binding and fused deposition modeling.

In various exemplary embodiments of the invention, apparatus 14 forms the layers by selectively dispensing the building material and curing the building material following the dispensing thereof and prior to the dispensing of the successive layer thereon. This type of apparatus is referred to as ink jet printing apparatus and is described, e.g., in U.S. Pat. Nos. 6,259,962, 6,569,373, 6,658,314, 7,183,335, 6,850,334, and 6,863,859, U.S. patent application Ser. Nos. 10/716,426, 09/484,272, 10/336,032, 11/433,513, US Publication No. 2005/0069784 and PCT Publication No. WO/2004/096527, all assigned to the common assignee of the present invention and fully incorporated herein by reference.

Figure 2A:
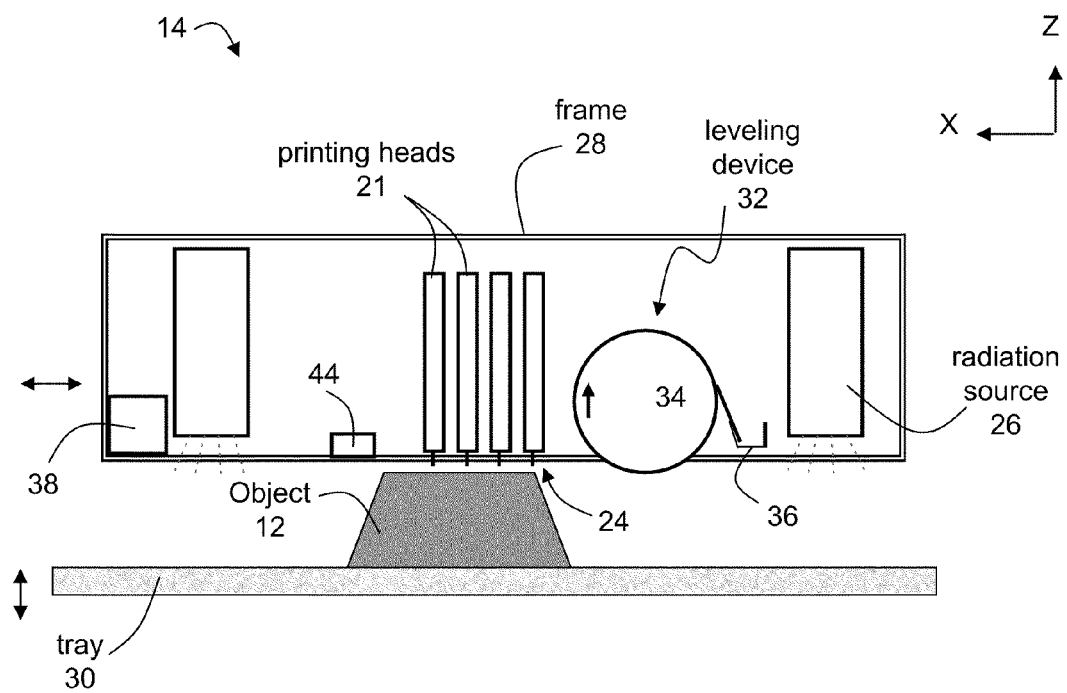
FIGS. 2a-c are schematic illustrations of a three-dimensional ink jet printing apparatus, according to various exemplary embodiments of the present invention.
Figure 2B:
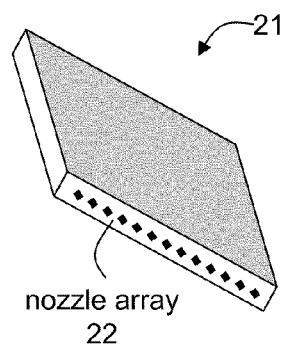
Figure 2C:
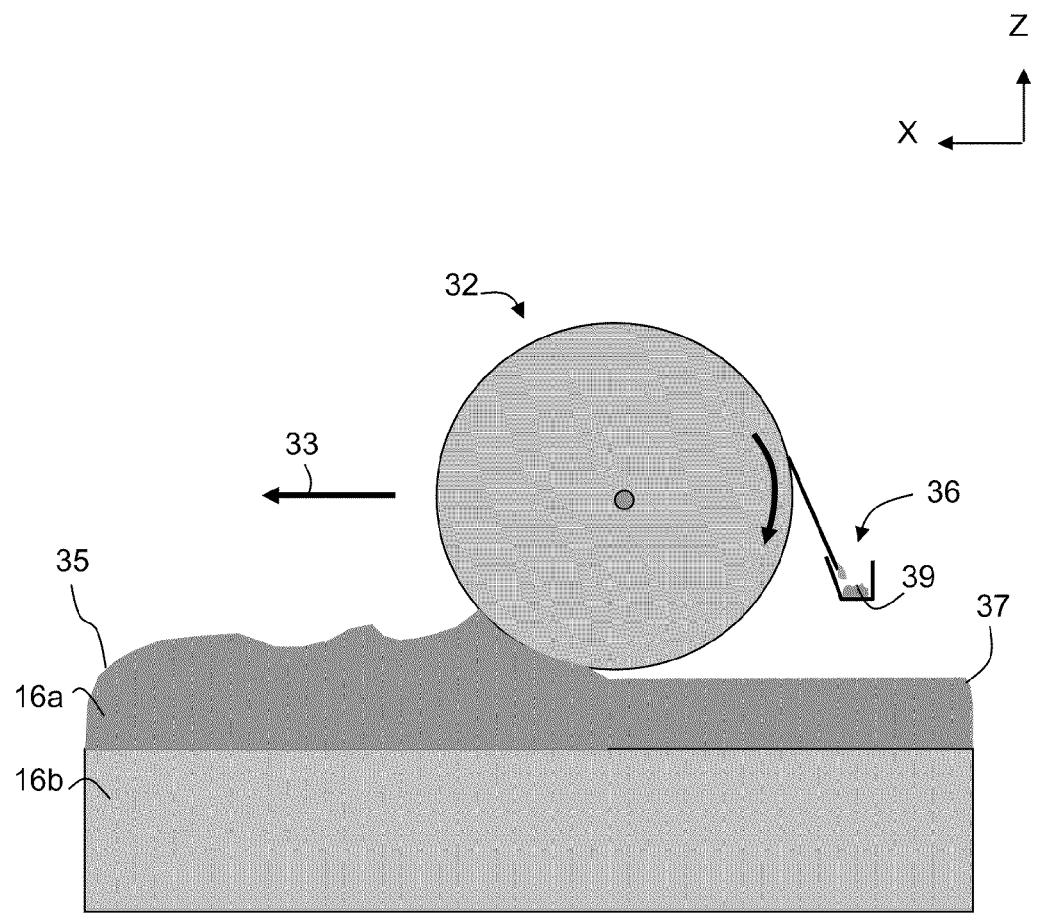

A representative example of three-dimensional ink jet printing apparatus 14 is schematically illustrated in FIGS. 2*a-c*, for the preferred embodiment in which apparatus 14 selectively dispenses the building material to form the layer.

In various exemplary embodiments of the invention apparatus 14 comprises one or more printing heads 21 having one or more nozzle arrays 22, through which building material 24 is dispensed. Printing heads 21 serve as layer-forming heads. Apparatus 14 can further comprise one or more radiation sources 26, which can be, for example, an ultraviolet or infrared lamp, depending on the building material being used. Radiation source 26 serves for curing the building material.

Printing head 21 and radiation source 26 are preferably mounted on a frame 28 operative to reciprocally move along a tray 30, which serves as the working surface. According to the common conventions tray 30 is positioned in the X-Y plane. Tray 30 is configured to move vertically (along the Z direction), typically downward. In various exemplary embodiments of the invention, apparatus 14 further comprises one or more leveling devices 32 which can be manufactured as a roller 34 or a blade. Leveling device 32 can be similar to the leveling device disclosed in U.S. Published Application No. 20050104241. Leveling device 32 straightens the newly formed layer prior to the formation of the successive layer thereon. Leveling device 32 preferably comprises a waste collection device 36 for collecting the excess material generated during leveling. Waste collection device 36 may comprise any mechanism that delivers the material to a waste tank or waste cartridge.

Preferably, apparatus 14 comprises a sensing device 44 which may be, for example, embedded within leveling device 32 or may be external thereto. Sensing device 44 serves to determine whether a collision with object 12 has occurred or is expected to occur. Such a collision may be, for example, as a result of dispensed layers being too thick and/or inconsistent in thickness, and/or because of a mechanical malfunction of the printing head. Collision may also occur as a result of material spill or faulty material dispensing that may occur anywhere in the path of the printing head. For example, sensing device 44 may be or include an acceleration-sensing device, a shock sensor and the like.

According to a preferred embodiment of the present invention, apparatus 14 further comprises a cooling unit 38 for cooling object 12 and or apparatus 14. Unit 38 may comprise a blowing unit and/or a sucking unit, for respectively cooling apparatus 14 by sucking hot air or other substances out of apparatus 14 and/or drawing cool air or other substances in to apparatus 14 from the surroundings.

In use, printing head 21 moves in the X direction and dispenses the building material in the course of its passage over tray 30, in a predetermined configuration. The passage of head 21 is followed by the curing of the deposited material by radiation source 26. In the reverse passage of head 21, back to its starting point for the layer just deposited, an additional dispensing of building material may be carried out, according to predetermined configuration. In the forward and/or reverse passages of head 21, the layer thus formed may be straightened by leveling device 32, which preferably follows the path of head 21 in its forward and/or reverse movement.

Leveling device 32 provides more than one improvement to the newly formed layer. Firstly, leveling device 32 ensures uniform and accurate layer height. Secondly, leveling device 32 eliminates undesired patterns in the form of grooves or ridges which may be caused by defective nozzles in printing head 21. Thirdly, leveling device 32 sharpens the edge of the newly formed layer, such that droplets of building material of the subsequent layer can be deposited at the proper target location on the leveled layer.

The operation of leveling device 32 is better illustrated in FIG. 2*c*, showing a newly formed layer 16*a* and a few previously formed layers 16*b*, where layers 16*b* are already leveled and cured and layer 16*b* is being leveled by device 32 which moves in a direction generally shown as 33. As shown, once layer 16*a* is formed it has generally round edges, which are subsequently sharpened by device 32. A round edge and a substantially sharper edge are illustrated in FIG. 2*c* as 35 and 37, respectively. While contacting the newly formed layer, device 32 discards from the layer excess material 39 which is collected by waste collection device 36.

Once head 21 returns to its starting point along the X direction, it may move to another Y position and continue to build the same layer by reciprocal movement along the X direction. Once the layer is completed, tray 30 is lowered in the Z direction to a predetermined Z level, according to the desired thickness of the layer subsequently to be printed. The procedure is repeated to form three-dimensional object 12 in a layerwise manner.

In another embodiment, tray 30 may be displaced in the Z direction between forward and reverse passages of head 21, within the layer. Such Z displacement is carried out in order to cause contact of the leveling device with the surface in one direction and prevent contact in the other direction.

While the above description of apparatus 14 places a particular emphasis on embodiments in which the layers are formed by selective dispensing and curing of building material, it is to be understood that more detailed reference to such technique is not to be interpreted as limiting the scope of the invention in any way. For example, other practitioners in the field form the layers by stereolithography, powder binding and fused deposition modeling (to this end see, e.g., in U.S. Pat. Nos. 4,575,330 and 5,204,055 supra).

Thus, also contemplated are embodiments in which apparatus 14 comprises a stereolithography apparatus. As previously indicated, stereolithography is a method and apparatus for three-dimensional printing of solid objects by successively forming thin layers of a curable material one on top of the other. A programmed movable spot beam of curing radiation on a surface or layer of curable fluid medium is used to form a solid layer of the object at the surface of the liquid. In a preferred embodiment, the curable fluid medium is an ultraviolet curable liquid and the curing radiation can be ultraviolet light. Once a solid layer of the object is formed, the layer is moved, in a programmed manner, away from the fluid surface by the thickness of one layer and the next cross-section is then formed and adhered to the immediately preceding layer defining the object. This process is continued until the entire object is formed.

Layer-forming head 13 of apparatus 14 may thus comprise a source of ultraviolet light which produces a spot of ultraviolet light on the surface of the curable liquid and moves it across the surface, for example, by the motion of mirrors or other optical or mechanical elements. The interaction between the curable liquid and the ultraviolet light results in solidification at their point of interaction. As the spot moves on the surface, a layer is formed. An elevator platform can be used to move the previously formed layer to a different (e.g., lower) location prior to the formation of the subsequent layer.

In another embodiment, apparatus 14 builds each layer of object 12 by spreading a layer of a powder material in a confined region, and applying a binder material to selected regions of the layer to thereby bond the powder material in the selected regions. In this embodiment, layer-forming head 13 of apparatus 14 may comprise a mechanism for spreading the powder material and another mechanism for dispensing the binder material. The powder material can be, for example, a ceramic powder. The binder material can be any material, organic or inorganic, known in the art which is capable of performing binding action between the particles of the powder material. The mechanism for spreading the powder can include a powder dispersion head which moves reciprocally while dispensing the powder material. The mechanism for dispensing the binder material can be in a form of several ink jet dispensers which move in the same reciprocal manner so as to follow the motion of the powder head. The ink jet dispensers selectively jet liquid binder material at selected regions, thereby causing the powdered material in these regions to bond. The powder/binder layer forming process is repeated so as to form the object in a layerwise manner.

As stated, controller 18 receives instructions from data processor 20 to ensure that each layer of the three-dimensional object is formed at a predetermined and optionally different thickness, such that post-formation shrinkage is compensated for. The shrinking process of the layers typically decreases with time.

Each time a layer is completed, the tray (or the printing head, together with leveling apparatus) is preferably displaced in Z direction. This mechanical step between layers is referred to hereinafter as a "Z step". In addition, tray 30 may be displaced in Z direction between forward and reverse X movements of the printing head.

Figure 3A:
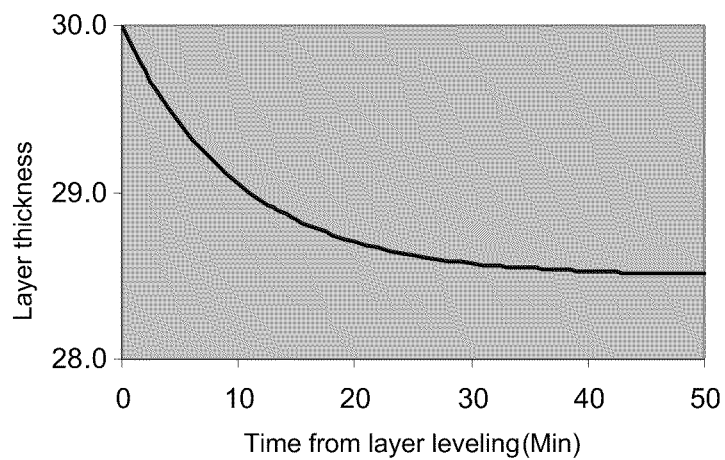
FIG. 3a is a plot exemplifying typical variation in the thickness of a layer as a function of time.

FIG. 3a exemplifies typical variation in the thickness, $D_i(\tau)$, of the ith layer as a function of time after being formed, $\tau$. The function $D_i(\tau)$ can be conveniently defined as:

$$D_i(\tau) = D_{0,i}[1 - a(1 - \text{Exp}(-\tau/b))] \quad \text{(EQ. 1)}$$

where, $D_{0,i}$, a and b are constant parameters, which depend on the process employed for forming the layer. $D_{0,i}$ the initial layer thickness, is not necessarily equal to the Z step because of the shrinkage of former layers during the formation of the new layer. Conditions which affect the value of the parameters include, without limitation, the initial thickness, the type of building material and the type and duration of the curing, bonding or solidifying process. Other conditions include, without limitation, the duration and type of leveling process, if employed. In the plot of FIG. 3a, the following values for the parameters were used: $D_{0,i} = 30$ μm, $a = 1.5$ μm, $b = 10$ min. As will be understood by one of ordinary skill in the art, the parameter b is the time-constant of the shrinkage process. For times much shorter than b, the layer's thickness varies rapidly, and for times much longer than b, thickness varies mildly or does not vary at all.

In three-dimensional printing processes in which the layer is formed by dispensing building material, leveling and curing it thereafter, a single layer is typically formed within a time-interval, $\Delta t$, which is from about 1 second to about 30 seconds. $\Delta t$ is referred to herein as a formation time or a duration.

As used herein the term "about" refers to ±10%.

With $\Delta t$, which is considerably shorter than the aforementioned time-constant (10 minutes in the above example), the layer may continue to shrink for a period of time after its formation. Except for the layers at the very bottom of the object, newly formed layers are thus formed on layers which are liable to shrink during the time between the last layer leveling and the leveling of the new layer ($\Delta t$). Hence the thickness of the new layer just after being leveled is larger than the controlled Z step. As time elapses, the layer becomes thinner due to its own shrinkage. As a consequence, the thickness of the higher layers is greater than the thickness of the lower layers. In sufficiently high layers, the two effects of shrinking (the cumulative shrinking of the layers below, and the shrinking of the new layer itself) compensate each other and the layer thickness approaches the Z step.

Figure 3B:
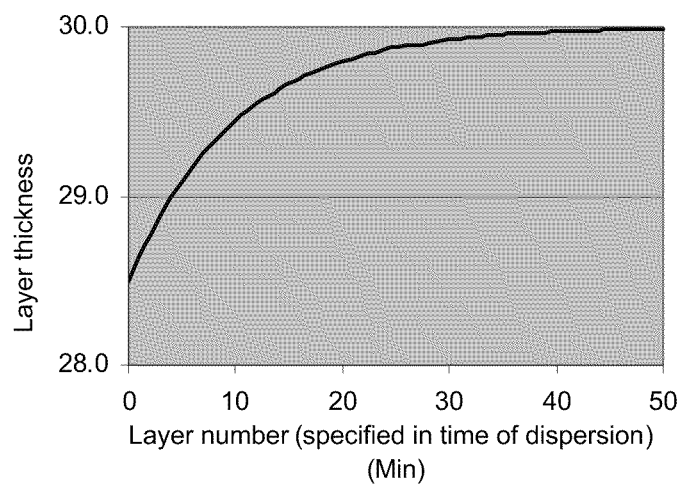
FIG. 3b is a plot exemplifying the individual final thickness of each of the layers which form the object, from the lowest layer upwards.

FIG. 3b exemplifies the individual final thickness of each of the plurality of layers forming the object, from the lowest layer upwards. In FIG. 3b, the ordinate of the plot represents the final thickness $D_f$ of layers and the abscissa of the plot represents the layer serial number expressed in terms of the elapsed time t from start of print of the object to the time of layer formation. Thus, in the abscissa of FIG. 3b, the value of $t=0$ corresponds to the lowest layer, and the value of $t=50$ minutes corresponds to the upper layer (formed 50 minutes after the lowest layer).

Using the exemplified expression of Equation 1, for a uniform Z step=$D_0$, the final thickness $D_f$ of the layers can be written as:

$$D_f = D_0 - a\text{Exp}(-t/b). \quad \text{(EQ. 2)}$$

The following describe ways to deal with the layer shrinkage, according to various exemplary embodiments of the present invention.

In one preferred embodiment, Z step (which may be a function of Z or, equivalently, t), of each layer is selected such that the final thickness $D_f$ of all the layers is as originally desired (e.g., substantially uniform thickness). In this embodiment, the supporting software, which slices the object into layers, regards the layers as having constant thickness. The layers are preferably formed at an initial thickness that complements the later shrinkage.

Mathematically such procedure can be written as follows:

$$Z \text{ step} = D_{c,t}, \quad \text{(EQ. 3)}$$

where $D_{c,t}$ represents the compensated Z step of the layer formed at time t after print start. It may be worthwhile noting again that due to the sequential nature of the three-dimensional printing process, the vertical positions of the layers correlate with the times at which they are formed.

According to a preferred embodiment of the present invention each layer is formed at a predetermined and different Z step characterized by one or more decaying functions of the vertical position (or, equivalently, the formation time) of the layer. The decaying functions are preferably, but not obligatorily, exponentially decaying functions. A single decaying function is favored when the layers of the formed object are of substantially uniform size, and two or more decaying functions are favored for more intricate objects, as further detailed hereinunder.

A representative example of a single exponentially decaying function, according to a preferred embodiment of the present invention is:

$$D_{c,t} = D_0 + a\mathrm{Exp}(t/b), \qquad (\mathrm{EQ.\ 4})$$

where, similarly to Equation 2, the layer serial number is expressed in terms of the elapsed time, t, from start of print.

Knowing the thickness and formation time of each layer, one ordinarily skilled in the art would know how to construct a function Z(t) converting the temporal variable t to the spatial variable Z. For example, neglecting the difference between $D_0$ and $D_t$, for layers of uniform formation time-interval, $\Delta t$, and $Z(t)=D_0(t/\Delta t)$. For the purpose of converting t to Z in Equation 4, the approximation $D_0=D_t$ is employed.

The present embodiments thus compensate for the post-formation shrinkage of the layer.

Replacing $D_0$ in Equation 2 by $D_{c,t}$ per Equation 3, and substituting the expression of $D_{c,t}$ per Eq. 4, one gets $$D_t(t) = D_{c,t} - a\mathrm{Exp}(-t/b) = D_0. \qquad (\mathrm{EQ.\ 5})$$

Figure 3C:
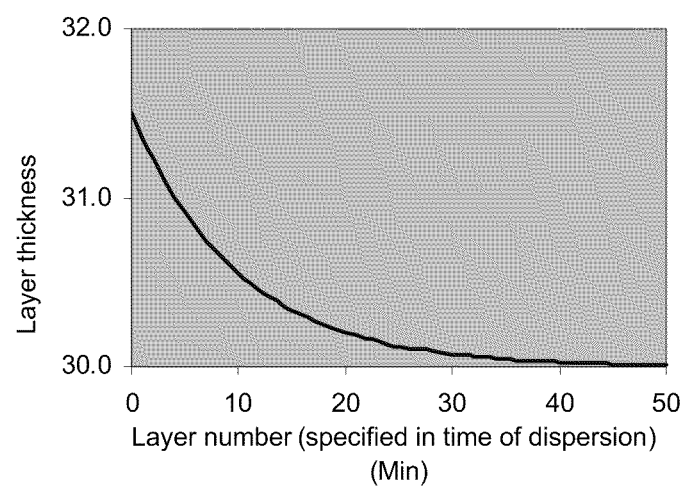
FIG. 3c is a plot exemplifying the compensated initial thickness of a layer as a function of the time at which the layer is formed, according to various exemplary embodiments of the present invention.

Hence, the parameter $D_o$ in Equation 4 represents the final thickness of the layers. The shape of $D_{c,t}$ for the aforementioned values of $D_{c,t}$ a and b is shown in FIG. 3c.

In another preferred embodiment of the present invention, the supporting software which slices the object into layers, refers to the thickness of the layer according to the actual final size $D_t$, e.g., per Equation 2. In this embodiment, a constant Z step, $D_0$, is used for the vertical motion.

When the object is formed from layers of different X-Y sizes, their typical formation time intervals $\Delta t$ also differ. In this embodiment, the function $D_c(t)$ is preferably a combination of several decaying functions, such as, but not limited to, exponentially decaying functions.

Figure 4A:
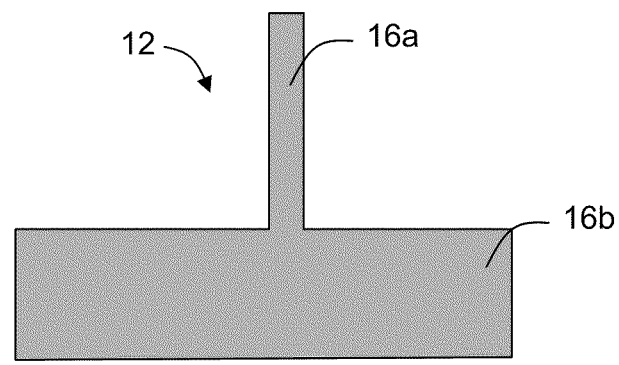
FIGS. 4a and 4c are schematic illustrations of objects manufactured in accordance with preferred embodiments in which the object is formed from layers of different sizes.

Reference is now made to FIG. 4a which is a schematic illustration of object 12 in the preferred embodiment in which object 12 is formed from layers of different sizes. Shown in FIG. 4a are small layers 16a formed on top of large layers 16b. The formation time interval of the small layers is shorter than the formation time interval of the large layers. As a result, at the beginning of the formation of the group of small layers the shrinkage is more pronounced. This is because at a higher layer (having a greater Z value) the shrinking process of the layer after being dispensed and cured tends to be balanced by the accumulated shrinkage of lower layers during the time $\Delta t$ between leveling before and after dispensing the layer. For small layers $\Delta t$ is smaller than for large layers. Therefore, although the last large layer (having large $\Delta t$) is, for example, near balance, balancing is not achieved at the beginning of the formation of the small layer group, due to the smaller $\Delta t$. In small layers $\Delta t$ is smaller and therefore, initially, the balancing is not sufficient. After more small layers (more than required in large layers) the balancing is sufficient.

The final thickness $D_t$ of the layers of FIG. 4a can be written as:

$$D_t = \begin{cases} D_0 - a_1\mathrm{Exp}(-t/b_1) & t < t_1 \\ D_0 - a_2\mathrm{Exp}(-t/b_2) & t > t_1, \end{cases} \qquad (\mathrm{EQ.\ 6})$$

where $t_1$ represents the time at which the formation of the small layers begins, $a_1$, $b_1$ are constant parameters corresponding to the formation of layers 14a, and $a_2$, $b_2$ are constant parameters corresponding to the formation of layers 14b. In various exemplary embodiments of the invention $b_2$ approximately equals $b_1$. Note that the expression for $t>t_1$ is an approximation. This is because the lower layers of a small layer comprise a varying mix of large and small layers, and therefore the nature of their accumulated shrinkage during said time $\Delta t$ gradually varies from one small layer to another small layer. For example, during the period $\Delta t$ of the initial small layers, the accumulated shrinkage is substantially due to the large lower layers, while for later small layers, the accumulated shrinkage of the lower layers is substantially due to small layers. Hence, the initial small layers are expected to behave according to one exponential expression while the much later small layers behave according to another exponential expression.

Figure 4B:
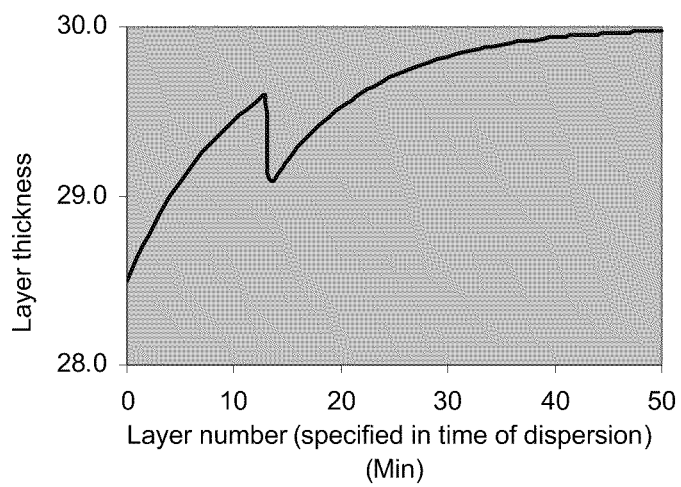
FIG. 4b is a plot exemplifying a typical form of the final thickness of the layers in FIG. 4a, according to various exemplary embodiments of the present invention.

FIG. 4b shows a typical form of the final thickness $D_t$ of the layers in FIG. 4a. For more than two different sizes (and formation time intervals), the function $D_t$ can comprise more decaying functions.

According to the presently preferred embodiment of the invention, the function $D_{c,t}$ which, as stated, represents the compensated Z step of the layer, can be written as:

$$D_{c,t} = \begin{cases} D_0 + a_1\mathrm{Exp}(-t/b_1) & t < t_1 \\ D_0 + a_2\mathrm{Exp}(-t/b_2) & t > t_1. \end{cases} \qquad (\mathrm{EQ.\ 7})$$

As will be appreciated by one of ordinary skill in the art, the function $D_{c,t}$ substantially compliments the function $D_t$, hence compensating for the post-formation shrinkage.

Once the printing is finished, all the layers may continue to shrink in X, Y and Z directions due to the process of cooling from the temperature of the object during printing to room temperature. According to a preferred embodiment of the present invention this shrinkage is compensated for by performing a global rescaling in the horizontal and/or vertical directions. Rescaling in the horizontal and vertical directions can be achieved by stretching the image of the object in the respective directions before slicing. Rescaling in the vertical direction can alternatively be achieved either in the printing stage, by rescaling the step size of the working surface (Z step); or in the slicing stage, by rescaling the designed thickness of the layers.

The required scale correction in Z direction after the printing finishes, as well as similar scale correction in X and Y directions, depend on the formation duration of the layers. Although the heat generated and absorbed at each point of the layer does not depend on the formation duration, the cooling amount of the layer is proportional to the formation duration. Therefore the longer the formation duration, the cooler the layer is. Hence, objects of long layer formation time are cooler than objects of short layer formation time after the printing finishes, and therefore the former contract less than the latter after cooling to room temperature. The contraction factor may differ for X, Y and/or Z directions. In particular global contraction in Z is preferably smaller than in X-Y. This is because part of the contraction in Z (from the very first high temperature of a newly built layer to the steady state temperature of the object during building) is constantly compensated by the leveling apparatus and constant Z step during building. The contraction in the X-Y direction, on the other hand, takes place consistently from the initial temperature of a newly built layer until the object cools to room temperature.

For example, for layer formation duration of 30 seconds the preferred global rescaling factor in the vertical direction is about +0.18% and the preferred global rescaling factor in the horizontal direction is about +0.26%, while for formation duration of 4 seconds the preferred global rescaling factor in the vertical direction is about +0.2% and the preferred global rescaling factor in the horizontal direction is about +0.3%.

The global rescaling factor is preferably a monotonically decreasing function, e.g., a linear function, of its formation time $\Delta t$. The rescaling factor S is preferably defined as:

$$S = S_0 + c\Delta t, \quad (\text{EQ. 8})$$

where $S_0$ and $c$ are predetermined parameters and $c<0$.

When the layer is rescaled along two different directions, a different rescaling factor can be used along each direction. For example, when the object dimensions are rescaled along the X and Y direction, the rescaling factors can be $S_x = S_{0,x} + c_x\Delta t$, and $S_y = S_{0,y} + c_y\Delta t$, respectively.

In case of layers with changing size from layer to layer, global rescaling in X-Y in a given direction can be computed and performed per layer. For a particular layer i the layer can be rescaled by a rescaling factor, $S_i$, which is preferably defined as:

$$S_i = S_0 + c\Delta t_i, \quad (\text{EQ. 9})$$

where $S_0$ and $c$ are predetermined parameters. In such case the center of mass of the layer after rescaling is preferably at the same location as before rescaling.

The coefficients $S_0$ and $c$ are preferably the same in both X and Y directions, because they reflect the generally isotropic characteristics of the building material.

Alternatively, the global horizontal rescaling factors can be written in the form $S_{i,x} = S_{0,x} + c_x\Delta t_i$ for the horizontal rescaling along the X direction and $S_{i,y} = S_{0,y} + c_y\Delta t$ for the horizontal rescaling along the Y direction.

Figure 4C:
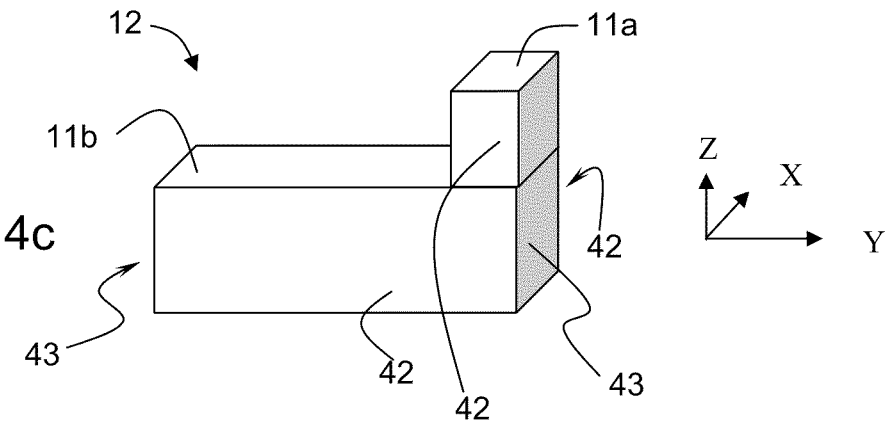

Different rescaling factor $S_i$ for different layers may, however, reduce the smoothness of vertical surface of the object. This is especially the case when the parameter $S_0$ of Equation 9 is positive and the parameter c is negative. In such situations, a single global horizontal rescaling factor S is preferred. A representative example of such situation is illustrated in FIG. 4c, showing object 12 with a lower small part 11a, an upper large part 11b. Also shown are side walls parallel to the Y-Z plane (generally shown at 42 and referred to as "X-walls") and side walls parallel to the X-Z plane (generally shown at 43 and referred to as "Y-walls"). When fabricating an object having such or similar shape, the scale $S_i$ in upper part 11b is larger than in lower part 11a. After rescaling, the layers in the upper part of such objects are larger in the X direction than the layers in the lower part. As a consequence, when the fabrication machine is, for example, an inkjet printing apparatus, the peripheral droplets in the X direction of the upper part may lack any support and tend to drip when printed. Some of these peripheral droplets may adhere to the X-walls of the object while others may fall on the tray. The final product in this case would therefore have inaccurate and unsmooth X-walls. The use of the same global horizontal rescaling factor for all the layers in accordance with the presently preferred embodiment, although not assuring the very absolute dimensions of all the object's parts, substantially prevents the above effect, because in this embodiment substantially all the peripheral non-void target locations of substantially all layers are well supported by non-void target locations of lower layers (or by the tray).

A single global horizontal rescaling factor can be determined from the formation duration of one of the layers (e.g., the first formed layer) using, e.g., the linear function of Equation 9 above. Once determined, this horizontal rescaling factor can be used as a global horizontal rescaling factor for all layers. Thus, according to the presently preferred embodiment of the invention the global horizontal rescaling factors are $S_x = S_{0,x} + c_x\Delta t_1$ for the horizontal rescaling along the X direction and $S_y = S_{0,y} + c_y\Delta t_1$ for the horizontal rescaling along the Y direction, where $\Delta t_1$ is the dispensing time of one predetermined layer (such as, but not limited to, the first layer).

A possibility to overcome the need for different scale factors in different layers, which according to the discussion above cannot be met, may be as follows: According to an embodiment of the present invention, $\Delta t$ (the layer's formation time) is kept constant for all the layers. This can be done, for example, by adding a pause between small layers, so as to have the same $\Delta t$ for small layers as for the larger layers below (the layer below is always equal to or larger than the current layer). The pause may, for example, include scanning a printing area that is as large as the area of the first (lowest) layer for all the layers. In this way, though fabrication time of the object increases, the dimensions of all object's parts may become accurate. An additional advantage of this embodiment is reducing object deformation brought about by different shrinkage of layers, when the layers are formed at different formation duration.

The present embodiments successfully address the problems associated with the planar resolution of the layers in three-dimensional printing.

It is appreciated that when a layer is formed, the thickness of the layer depends on the volume of building material in each occupied target location (e.g., an ejected material droplet) on the layer and on the density of the occupied target locations. For example, suppose for simplicity that the layer is formed according to a rectangular bitmap in which the bitmap elements are arranged in n rows (arranged, say, along the Y direction) and m columns (arranged, say, along the X direction). Suppose further head 15 of printing apparatus 14 scans the layer along the X direction and is configured to simultaneously form the n rows in a single scan (this can be achieved, for example, using a printing head having an array of at least n nozzles arranged along the Y direction, see, e.g., FIG. 1b).

Typically, layers are defined as being composed of a continuous spread of material. Therefore, for a given volume of building material at each occupied target location, and given material tendency to spread on the working surface, there is a minimal density of the rows and a minimal density of the columns which can be defined without causing vacant spaces between the building materials of two adjacent occupied target locations. Once the density is above the minimal density, the building material can be "piled" and affect the layer thickness or the vertical resolution of the three-dimensional object. If, for example, the density of rows reaches its minimal value, the layer thickness is a function of the density of columns.

In various exemplary embodiments of the invention, controller 18 ensures that each layer is formed at a predetermined thickness and a predetermined planar resolution. For simplicity of explanation, the planar resolution and the density of material droplets are treated equivalently. More specifically, each planar pixel is regarded as containing (or devoid of) one single material droplet. When the planar resolution exceeds certain height limits, predetermined thickness is preferably achieved by diminishing the spread of building material per unit area in the layer. In this way both the desired thickness and the desired planar resolution are maintained.

According to a preferred embodiment of the present invention, the diminishing is not performed around the rim of the layer, where the required planar resolution should be preserved. The diminishing is particularly useful when it is desired to increase the resolution in the X direction. The spread of building material per unit area is therefore diminished so as to compensate for any increment in the layer's thickness which may occur as a result of the increased resolution. The dismissing can be done by diluting the spread of building material, by reducing the size of droplets, and the like.

According to a preferred embodiment of the present invention, the extent by which the spread of building material per unit area is diminished equals the relative increment in thickness which would occur if no diminishing is employed. For example, suppose that the diminishing is done by dilution, and that the increased resolution results in a 25% increment in layer's thickness from desired resolution. In this case, a 25% dilution of building material per unit area can compensate for such thickness increment and maintain the desired thickness of the layer. As will be appreciated by one ordinarily skilled in the art, such dilution allows formation of layers at high resolution.

Figure 5:
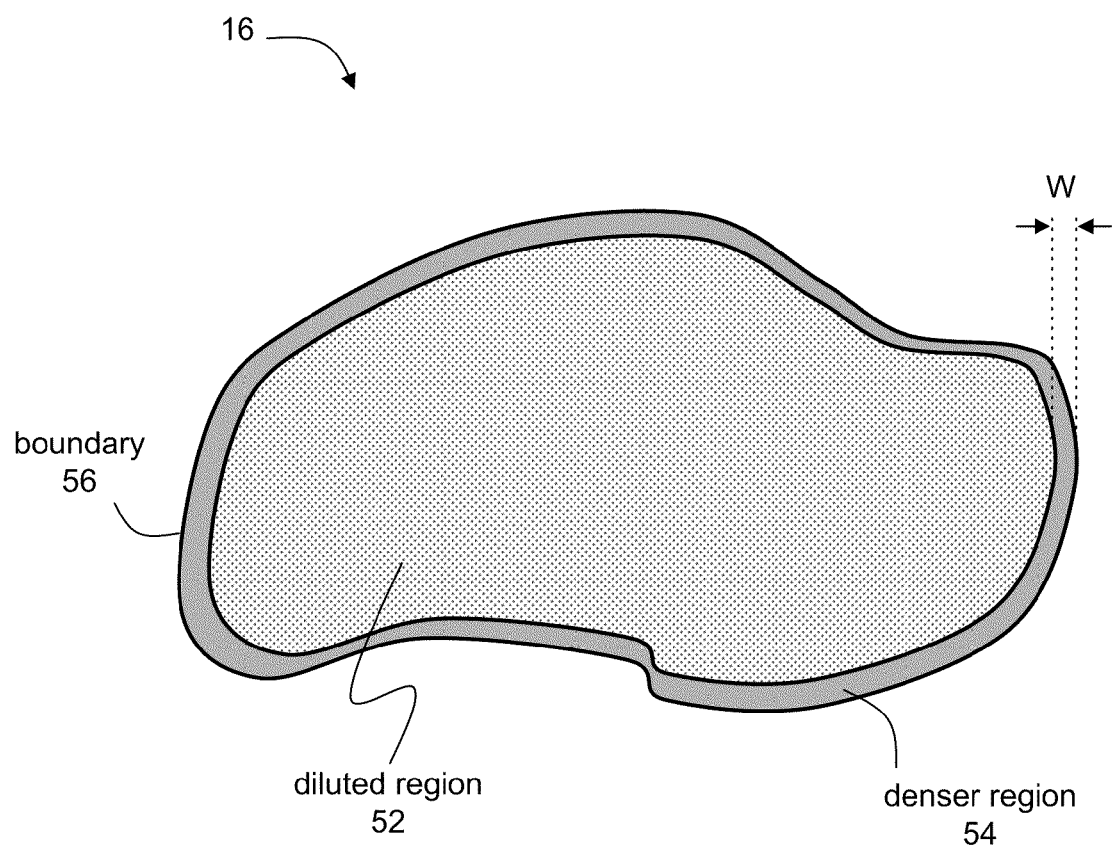
FIG. 5 is a schematic illustration of a procedure for performing local dilution of a layer, according to various exemplary embodiments of the present invention.

Reference is now made to FIG. 5a, which is a schematic illustration of a procedure for performing local dilution of layer 16. According to the presently preferred embodiment of the invention the local dilution is performed by diluting the spread of building material exclusively at an inner portion of layer 16, thereby providing a central diluted region 52 surrounded by a peripheral denser region 54.

Figure 6A:
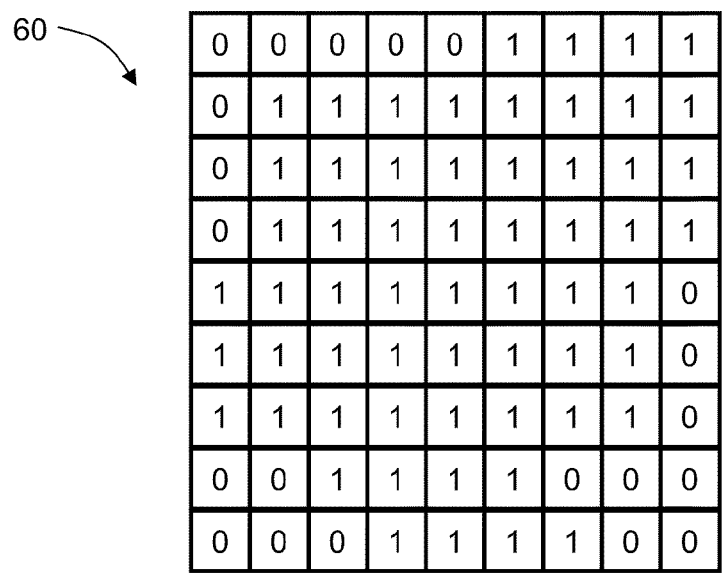
FIGS. 6a-b are schematic illustrations of a dilution transformation of a bitmap of material droplets (or cells) in an exemplary embodiment in which a dilution of about 25% is employed.
Figure 6B:
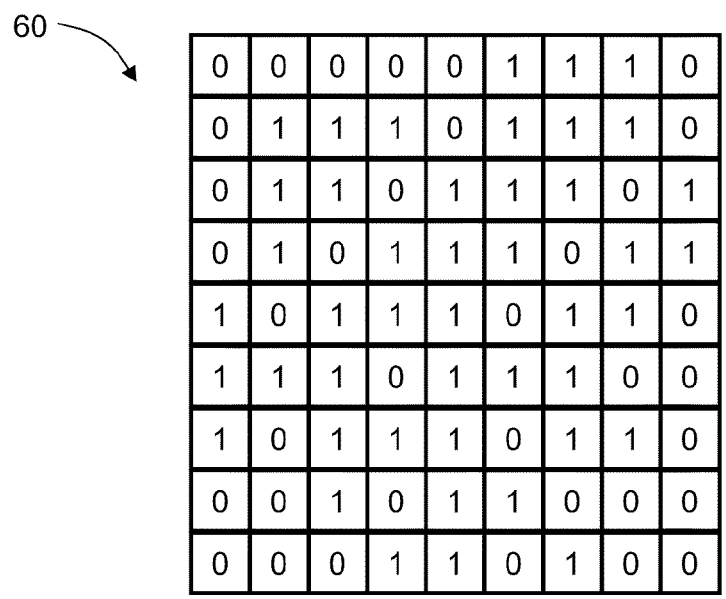

The dilution is preferably performed by controller 18 or data processor 20 at the bitmap level. Specifically, the bitmap of the respective layer is subjected to a dilution transformation such as to reduce the amount of building material in the regions which are to be diluted. For example, regions of "1"s in the bitmap of the respective layer are redefined such that the value of one or more bitmap elements in the regions is replaced from a "1" to a "0". FIGS. 6a-b schematically illustrates a dilution transformation of a bitmap in an exemplary embodiment in which a dilution of about 25% is employed. Shown in FIGS. 6a-b is a portion of a bitmap 60 before (FIG. 6a) and after (FIG. 6b) the dilution transformation was performed. As shown, the dilution transformation replaces every fourth "1" in the bitmap by a "0", thereby providing a diluted portion of the bitmap and a corresponding diluted region on layer 16.

Preferably, the dilution procedure is performed substantially evenly and at a substantially fine resolution so as to enable the building material to flow into the vacant target location. In various exemplary embodiments of the invention a different dilution transformation is used for different layers to reduce or eliminate accumulated holes in the layers. The variations between dilution transformations across the layers can be random or according to a predetermined rule.

The width W of region 54 can equal a width of a single target location on layer 16 (corresponding to a single bitmap element). Preferably, W equals the combined widths of several target locations on layer 16. W can have a substantially uniform value along the boundary 56 of layer 16 or it can vary along boundary 56 as desired. Peripheral denser region 54 serves for maintaining the accuracy per the required resolution. In the preferred embodiment in which leveling is employed, region 54 serves also for enhancing the sheerness of the edge of the layer after being leveled.

Figure 7A:
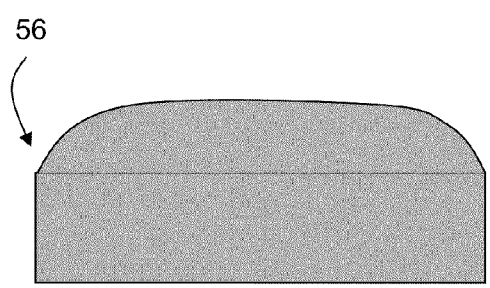
FIGS. 7a-d are a side view of a formed layer with (FIGS. 7b and 7d) and without (FIGS. 7a and 7c) a peripheral denser region, before (FIGS. 7a-b) and after (FIG. 7c-d) leveling, according to various exemplary embodiments of the present invention.
Figure 7B:
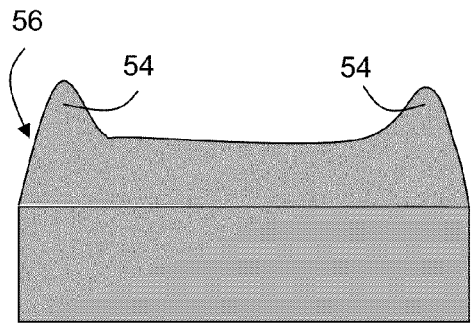
Figure 7C:
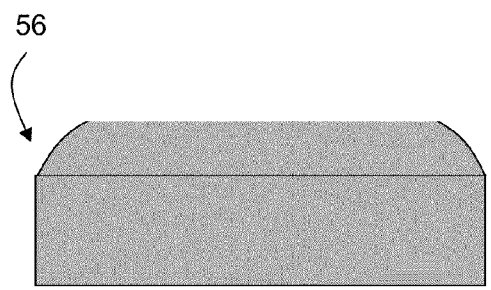
Figure 7D:
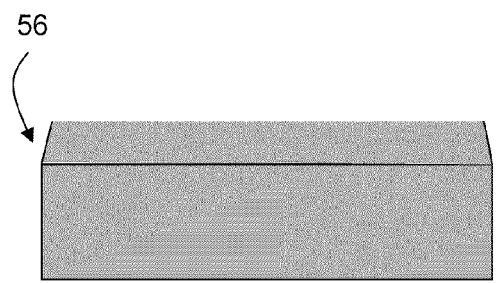

FIGS. 7a-d schematically illustrate a side view of the formed layer before (FIGS. 7a-b) and after (FIGS. 7c-d) leveling. FIGS. 7a and 7c illustrate a layer of uniform droplet density over the whole layer (either high droplet density with uniform dilution, or small droplet density without dilution). As shown in FIG. 7c, after leveling, the boundary 56 is substantially round. FIGS. 7b and 7d illustrate a high droplet density layer with dilution except at the periphery region 54. In which case, after leveling boundary 56 is much steeper than in FIG. 7c.

Local dilution can also be performed when it is desired to reduce the produced waste. The waste ratio of a layer is defined as the amount of excess material 39 (see FIG. 2c) which is discarded by leveling device 32 during the leveling of the layer, expressed as a percentage or fraction of the total amount of material which is dispensed during the formation of the layer. The waste ratio induced by leveling device 32 generally depends on the thickness of the layer and the desired build quality. Specifically, the waste ratio is a decreasing function of the thickness and an increasing function of the build quality. The reason for the latter is that build quality (per a given build resolution) depends on the sharpness of the layer edge. Larger waste ratio means that the leveling apparatus discards more material, and as a consequence the layer edge becomes sharper. Sufficiently high build quality can be achieved by controlling the amount of building material which is discarded by the leveling device. Broadly speaking, if the amount of discarded material is too low, dripping of building material may be found on vertical walls of the object.

For example, it was found by the present Inventors that for a layer thickness of about 16 μm (after leveling), sufficiently high build quality is achieved when the leveling device discards about 25% of the material, and for a layer thickness of about 32 μm (after leveling), sufficiently high build quality is achieved when the leveling device discards about 20% of the dispensed material.

In a conventional three-dimensional ink jet printing apparatus, the waste ratio ranges typically from about 10% for thick layers with low build quality to about 30% for thin layers with high build quality. It was found by the inventor of the present invention that the waste ratio can be reduced while maintaining the desired build quality. As stated, the objectives of leveling device 32 are, inter alia, to eliminate undesired patterns and sharpen the edges of the layers. Successful accomplishment of these objectives ensures the three-dimensional formation of an object having substantially smooth surfaces and accurate outlines. For these objectives to be accomplished, it is sufficient to dispense a larger amount of material at exterior or near-exterior regions of the layer, while diluting the spread of material in other regions. Thus, in various exemplary embodiments of the invention the spread of building material in the layer is diluted so as to minimize the amount of excess material 39 collected by the waste collection device, while at the same time maintaining the predetermined resolution and edge sharpness (and as a consequence object's quality) at the exterior surfaces of the object.

This can be achieved by defining, for each layer, one or more interior regions, and diluting the spread of material exclusively in the interior region(s) while maintaining the full (undiluted) amount of dispensed material at any region other than the interior region(s).

Figure 8A:
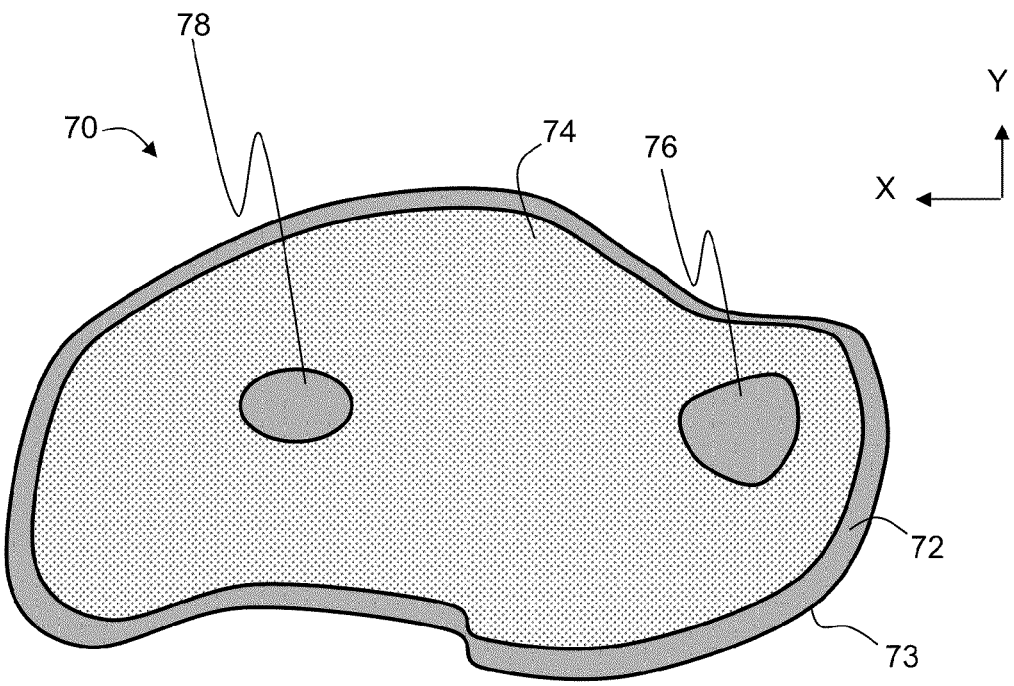
FIGS. 8a-b are schematic illustrations of a further procedure for performing local dilution of a layer, according to various exemplary embodiments of the present invention
Figure 8B:
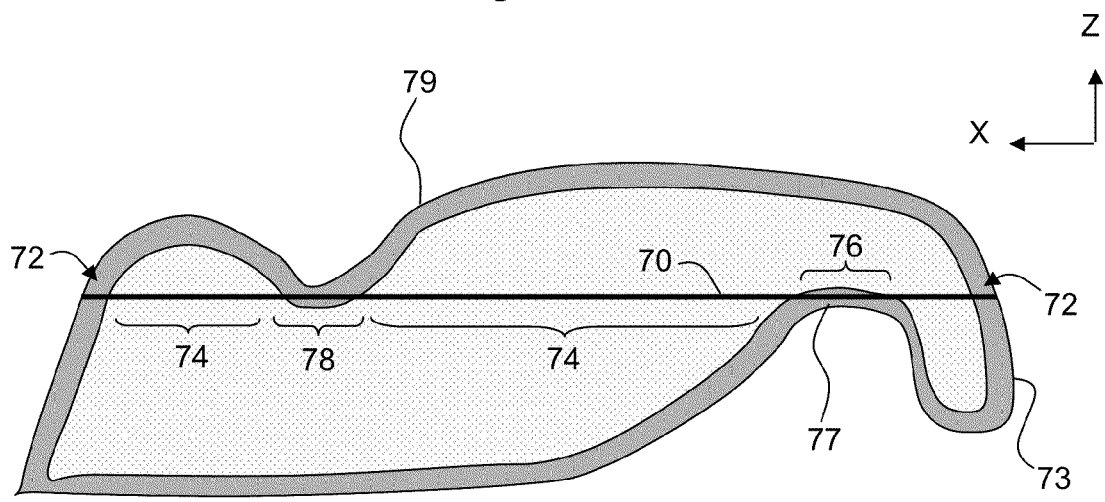

The procedure can be better understood with reference to FIGS. 8a-b. FIG. 8a is a schematic illustration of a layer 70 in a plane parallel to the X-Y plane, and FIG. 8b is a schematic illustration of three-dimensional object object 12 as projected on a plane parallel to the X-Z. The Z level of layer 70 is illustrated in FIG. 8b as a horizontal line parallel to the X axis.

Shown in FIG. 8a, are four regions, designated by numerals 72, 74, 76 and 78. Following the leveling of layer 70, each of regions 72, 76 and 78 is expected to be in horizontal and/or vertical proximity to one of the exterior surfaces of the three-dimensional object 12. Thus, regions 72, 76 and 78 are not interior regions of layer 70. More specifically, region 72 includes all the target locations which are expected to be in horizontal proximity to the surrounding surface 73 of object 12, region 76 includes all the target locations which are expected to be in vertical proximity to the bottom surface 77 of object 12, and region 78 includes all the target locations which are expected to be in vertical proximity to the top surface 79 of object 12.

Unlike regions 72, 76 and 78, region 74 is an interior region. That is, region 74 is characterized by a sufficiently large distance from the closest exterior surface of the object. The interiority of region 74 can be ensured by defining region 74 such that $\min(d_1, d_2, d_3) > d_T$, where $d_1$, $d_2$ and $d_3$ are, respectively, the minimal distances between region 74 and the top 79, bottom 77 and surrounding 73 surfaces, and $d_T$ is a predetermined threshold distance. A typical threshold distance is from about 0.5 mm to about 2 mm.

By diluting the spread of material exclusively in region 74 and maintaining the predetermined resolution in other regions the waste ratio can be reduced by a factor of at least 2, or preferably 3, 4 or 5.

Figure 9:
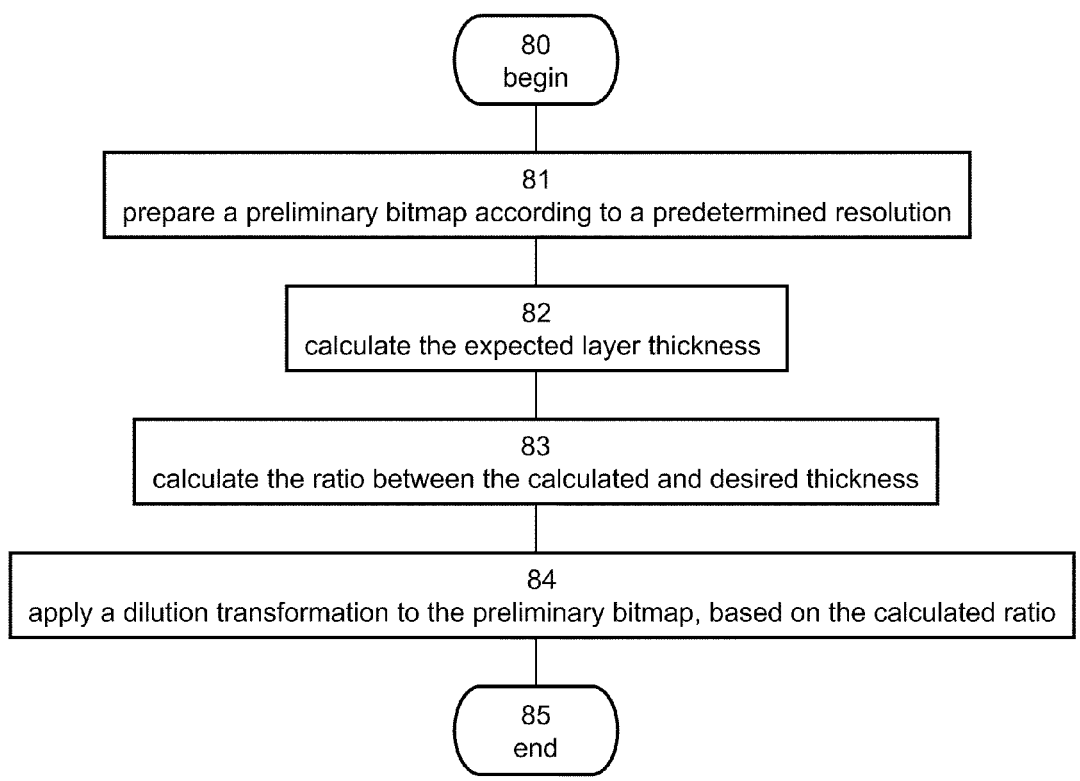
FIG. 9 is a flowchart diagram of a preferred method for preparing a bitmap of droplets corresponding to a predetermined resolution of a layer, according to various exemplary embodiments of the present invention.

Reference is now made to FIG. 9 which is a flowchart diagram of a preferred method for preparing a bitmap corresponding to a predetermined resolution of a layer, according to various exemplary embodiments of the present invention. The predetermined resolution can be characterized by a high density of columns. Typically, the resolution is above 600 dpi, and preferably above 720 dpi, for example, about 1200 dpi.

The method begins at step 80 and continues to step 81 in which a preliminary bitmap of the layer is prepared according to the predetermined resolution in the X direction. For example, a 1200 dpi operating bitmap can be prepared. The method continues to step 82 in which expected layer thickness is calculated. The calculation of the expected thickness is based on the obtained high resolution preliminary operating bitmap, the type of building material and the volume thereof in the occupied target locations. The method continues to step 83 in which the ratio between the calculated thickness and the desired thickness is calculated. Denoting the thickness resulting from the high-resolution preliminary bitmap by $h_{hr}$ and the desired thickness by $h_0$, the ratio R is defined as $h_{hr}/h_0$. The ratio R is preferably larger than unity because the high-resolution operating bitmap typically results in greater thickness than required. A typical value for R is, without limitation, from about 1.2 to about 2.

The method continues to step 84 in which a dilution transformation is applied to the preliminary bitmap. As explained above, the dilution transformation corresponds to dilution of building material spread in the layer. The dilution transformation is applied based on the calculated ratio, R. For example, R=1.5 can correspond to a 33% dilution. The dilution can be made in the X direction or, more preferably, in both the X and Y directions.

The method ends at step 85.

The present embodiments successfully provide solutions for the case in which the density of rows exceeds its optimal value.

Printing layers with a higher Y resolution than density of nozzles in the Y direction can be performed in more than one way. In one preferred embodiment, the head performs two or more X scans, while employing an interlaced printing method. When the layer dimension in the Y direction is larger than the dimension of the head in the Y direction, more X scans of the head can be performed to complete the layer. According to a preferred embodiment of the present invention the Y resolution is equal to the density of nozzles in the Y direction multiplied by a natural number.

In interlaced printing, the head prints, for example, every second, third, etc. row, rather than every successive row. Once a scan is completed, the head performs a subsequent scan and prints the rows or part of the rows that were skipped in the previous scans. The subsequent scans can be performed either at the same vertical level or at a vertical level which is shifted with respect to the previous scan. In the case of two scans per layer, for example, the interlaced portions which are produced in each such scan are referred to as "odd-rows" and "even-rows", respectively, corresponding to odd-number and even-number lines of the bitmap. The interlacing is performed by shifting the head in the Y direction between successive X scans until the nozzles are properly positioned for printing some or all the previously skipped rows.

As will be appreciated by one of ordinary skill in the art, when the resolution in Y direction is larger than the optimal row density and the optimal density is larger or equal to the density of nozzles, more than one scan is required for each layer. Moreover, in part of the scans, the rows may land on the top of the rows of preceding scans of the same layer, since the number of rows per unit Y length in the same plane is limited. According to a preferred embodiment of the present invention, for each such layer the leveling device (and optionally the printing head) is at a first Z level during the first group of scans in which the rows fill the first level (referred to herein as sub-layer), a second Z level during the second group of scans in which the rows fill the second level, a third Z level in the third group of scans, etc. The nozzles in each scan are preferably interlaced with the nozzles in the preceding scans so as to add rows between rows of the preceding scans. The preferred number of groups equals the Y resolution divided by the optimal row density. Optionally, the rows in a scan group are added on top of rows of the preceding scan groups.

In various exemplary embodiments of the invention each scan is performed so as to dispense substantially the same number of rows, and the height differences between successive groups of scans (of the same layer) are uniform. Specifically, denoting the number of groups of scans per layer by n and the layer thickness by $\Delta Z$, the Z level difference dZ between successive groups of scans preferably equals $dZ=\Delta Z/n$.

For example, suppose that the density of the head's nozzles is 75 dpi, the optimal row density is 300 dpi, the required row resolution is 600 dpi and layer thickness $\Delta Z$ is about 30 μm. In this case n=600/300=2, dZ=30/2=15 and the head preferably scans 8 times over the object in order to fabricate one original layer. Half of the scans may be performed when the head moves in a forward (+X) direction and the other half when the head moves in the reverse or backward (−X) direction. In each scan, all nozzles are operative and the rows are dispensed at a density of 75 dpi, with a Y shift of the head between successive scans to ensure interlacing. Preferably the Y shift is selected so as to print each row substantially in the center between two previously printed rows, thereby improving the fabrication quality of the layer. The first 4 scans form a first sub-layer and are dispensed with the leveling device at a given height above the tray (until the optimal row density is reached). The second 4 scans form a second sub-layer, and are dispensed with the roller at a height of about 15 μm above the former height.

The computation of the bitmap for performing the scans (8 scans per layer, in the present example) can be performed in more than one way. In one embodiment, the data for the required row resolution (600 dpi data in the present example) is computed once for all the scans as if the building material comprises a single thick layer. In another embodiment, the data for the first sub-layer is computed in accordance with the first height of the roller (relative to the tray), while the data for the second sub-layer is computed in accordance with the second height of the roller. For each sub-layer it is sufficient to compute the part of the bitmap, which corresponds to the rows printed in the respective scans (4 scans in the present example). Alternatively, all rows that comprise the required row resolution for a given Z level are computed for each sublayer, although only part of the computed rows (e.g., even rows, odd rows) is actually dispensed.

When the rows of a high Y resolution layer are dispensed in two or more interlaced sub-layers, Y resolution of the resultant build is very similar to Y resolution of an object built in a single sub-layer using a denser nozzle array. This is particularly the case for thin sub-layers, because when the sub-layers are thin, the rows of the different sub-layers can be viewed as printed substantially in the same plane (and thus preserving the high Y resolution). When the rows are also computed in the very Z level of the respective sub-layers, it will be appreciated that since the data relating to each sub-layer corresponds to the Z level of the sub-layer, a high Z resolution of $1/dZ$ (which is larger than $1/\Delta Z$) is achieved.

The preparation of a bitmap for each sub-layer is favored from the stand point of product quality (higher vertical resolution) and the preparation of a bitmap once per layer is favored from the stand point of manufacturing cost (reduced computer resources).

The different bitmaps of all layers and sub-layers are preferably prepared and read with respect to the same horizontal reference frame of the virtual object or of the tray. Technically, it may be required to shift the Y origin of the sub-layers from one another with respect to the virtual object, due to the lower Y resolution of the sub-layer as compared to that of the present layer. In this case a respective shift of the origin with respect to the tray (or to the object) is preferably performed while printing the sub-layers.

It is recognized that inaccuracies and/or imperfections which may occur in the final object, may have serious consequences. For example, when the object includes two or more parts designed to fit together, a slight inaccuracy may render the assembly of the parts impossible. Imperfections in the printed object may occur, for example, when one or more nozzles of the printing head are wholly or partially blocked, defective or non-functional.

Figure 10:
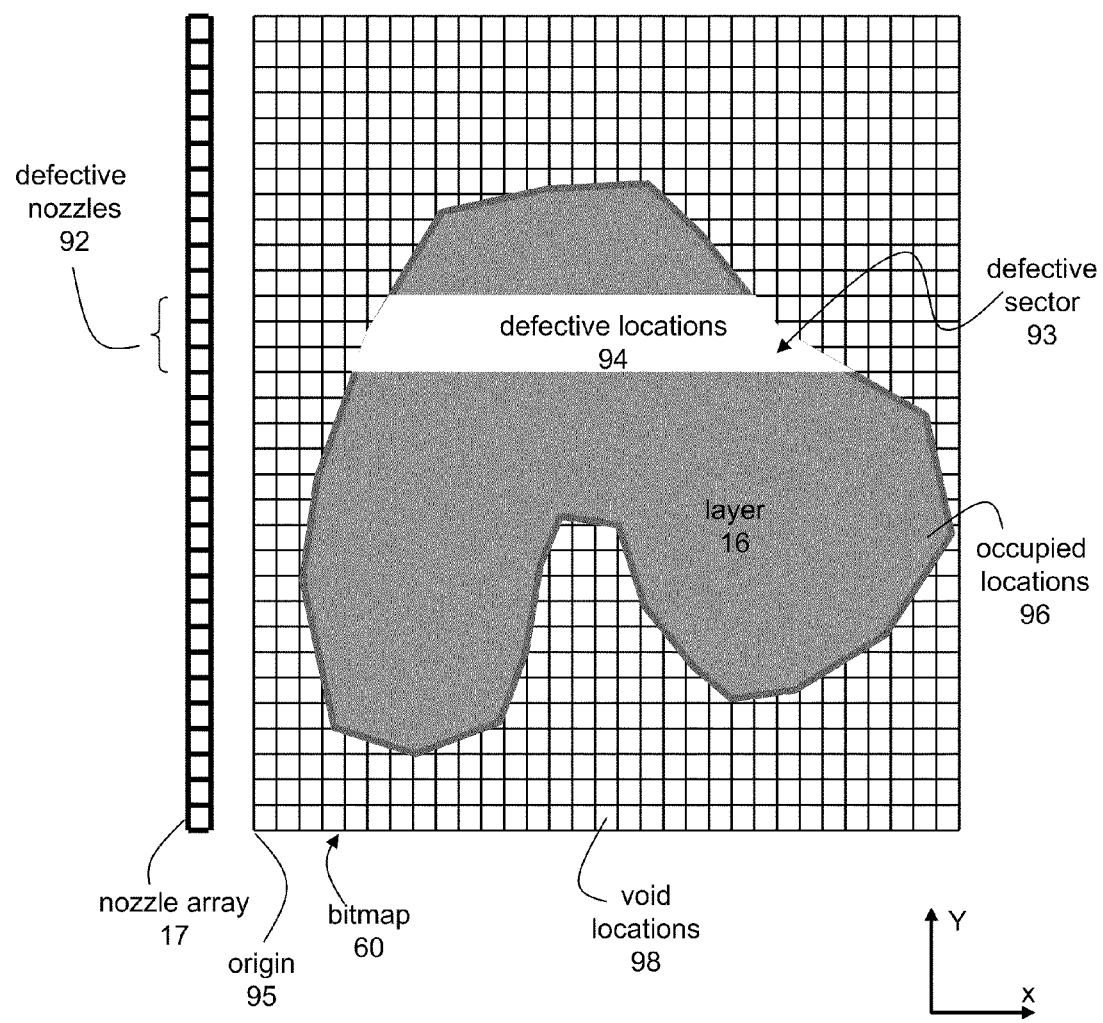
FIG. 10 is a schematic illustration of a layer, a bitmap and a nozzle array having defective nozzles.

Reference is now made to FIG. 10 which is a schematic illustration of nozzle array 17 in which there are three defective nozzles, designated by numeral 92. Also illustrated in FIG. 10 is a top view of layer 16 formed of occupied locations 96 printed by array 17, and bitmap 60 defined with respect to a reference frame having an origin 95. For better understanding of the relationship between layer 16 and bitmap 60, layer 16 overlays bitmap 60. The elements of bitmap 60 which are not overlaid by layer 16 represent void locations 98. It is to be understood that in reality there is no overlaying relation between layer 16 and bitmap 60, because layer 16 is a physical object while bitmap 60 is virtual. Nevertheless both occupied locations 96 and void locations 98 correspond to physical locations on layer 16.

When the printing head includes one or more defective nozzles 92, there is an insufficient amount of or no building material in target locations visited by the defective nozzles. Such target locations are referred to herein as "defective locations", and are designated in FIG. 10 by numeral 94. It is to be understood, however, that not all target locations which are not occupied by building material are defective. One of ordinary skill in the art would appreciate the difference between defective locations 94 and void locations 98, the latter being defined as target locations which are not designated to be occupied by building material.

As illustrated in FIG. 10, the existence of defective nozzles 92 results in the formation of defective sectors 93 of missing or insufficient building material.

The present embodiments successfully address the problem associated with defective or non-functional nozzles in three-dimensional printing. According to a preferred embodiment of the present invention, controller 18 ensures that array 17 dispenses an increased (e.g., double) amount of building material in occupied locations located just above defective sectors 93. The procedure is further explained hereinunder with reference to FIG. 11.

Figure 11:
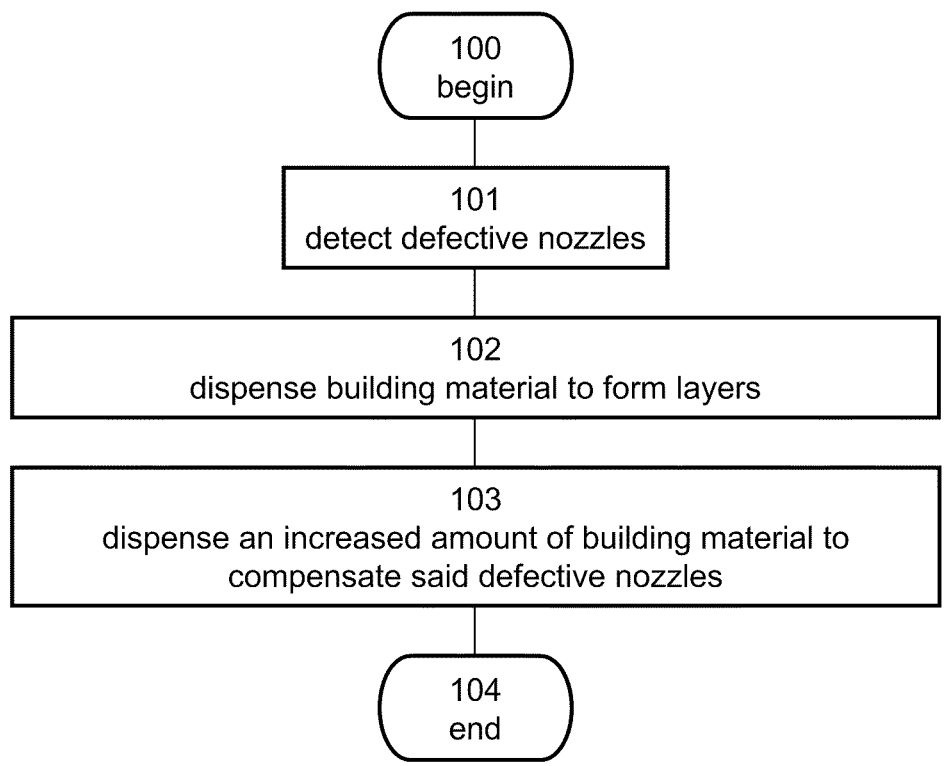
FIG. 11 is a flowchart diagram of a method for three-dimensional printing of an object, according to various exemplary embodiments of the present invention.

FIG. 11 is a flowchart diagram of a method for three-dimensional printing of an object, according to various exemplary embodiments of the present invention, using a three-dimensional printing apparatus having a printing tray and a printing head configured to dispense building material through at least one nozzle array.

The method begins at step 100 and continues to step 101 in which defective nozzles and non-defective nozzles are detected. For example, a nozzle test procedure may be executed periodically, in which the printing head operates for one or more scans, in which test droplet series are dispensed for each nozzle. The operator, or a nozzle detector unit, may check the test printout to detect defective locations from which the array-index of the defective nozzles can be inferred. Such a printout may be done on tray 30, on a paper sheet attached to tray 30 or on another suitable medium. According to another technique, the nozzle array jets series of droplets in nozzle-by-nozzle sequence onto a waste container, with a droplet detector unit checking the emerging droplets from each nozzle in order to determine the nozzle status. The data indicating the status of nozzles may be stored in data processor 20 or controller 18 and later used by controller 18 as further detailed hereinbelow.

The method continues to step 102 in which the printing head is moved repeatedly over the printing tray while dispensing the building material to thereby form the layers. When the printing head includes defective nozzles each formed layer inevitably includes defective sectors formed of the locations visited by the defective nozzles. The method continues to step 103 in which an increased amount of building material is dispensed so as to compensate for the defective sectors in a preceding layer by filling out the sector's dip.

Preferably, steps 102 and 103 are executed substantially contemporaneously. Thus, controller 18 ensures that, for each two adjacent layers (say, layers i and i+1), non-defective sectors in the upper layer i+1 overlap defective sectors in the lower layer i, and the nozzles of said non-defective sectors dispense an increased amount of building material. In other words, layer i+1 is formed such that an increased amount of building material is dispensed on the target locations which are substantially above defective sectors of layer i.

The overlap between non-defective sectors in the upper layer and defective sectors in the lower layer can be achieved by shifting the head in the Y direction between layers in a manner such that non-defective nozzles assume substantially the same Y coordinate as the defective nozzles assumed in the preceding layer. Y shift 4 that is used for compensating defective nozzles is typically measured in integer units representing number of nozzles shifted. In addition to $\phi$, Y is shifted one or more pixels in order to accomplish the Y interlacing, as required between different X scans. The overall shift $\psi$ is an integer number when measured in number of Y pixel steps. Each nozzle preferably receives printing information from the row of the bitmap which corresponds to the temporal Y position of the nozzle. It is expected that the compensating nozzles in the successive layer dispense twice the normal amount of material so as to fully compensate for the previously missing material. Nevertheless, more layers may be required for full compensation. For example, when the amount of material is increased by a factor of 1.33, three layers are required for the compensation.

According to another embodiment of the present invention, the compensation for missing material in a sector of a preceding layer is achieved without changing the dispensing rate of the nozzles. In this embodiment, the compensation is achieved by the dispensed material in a set of k layers which immediately follow the defective sector. Thus for each given layer, the controller preferably shifts the head in the Y direction to ensure that non-defective nozzles scan rows which lie substantially above the defective sector in k layers following the given layer. This procedure resembles the procedure of compensating for missing nozzles in U.S. Pat. No. 6,259,962, except that instead of random shifts of Y from layer to layer, the shifts according to the present embodiments are selected from a predetermined series of shifts, based on the acquired information regarding the nozzles' status.

The algorithm which controls the shifting in the Y direction preferably uses bitmap information of each individual layer, so as to ensure that all or most of the defective sectors are treated. In addition, when a plurality of Y shifts series that accomplish the procedure are possible, the shifting algorithm can employ randomization so as to prevent periodical artifacts on the built object.

In the preferred embodiments in which leveling device 32 is employed (see FIGS. 2a and 2c), the value of k is preferably selected according to the characteristic operation of device 32. This is because the operation of device 32 may reduce the amount of building material near the defective region. For example, when device 32 trims a quarter of the layer's thickness, the dip created by the defective nozzles is filled up after 4 layers. In this case, the preferred value of k is at least 4. Still, as the number of possibilities to shift the head in Y direction (for a given full range of the horizontal shift $\phi$) decreases with the increase in the value of k, the minimal value of k (k=4 in the present example) is preferred. Typical value of the full range of $\phi$ is between 10 and 150 nozzles. That means that $\phi$ can have integer values from 1 to a number between 10 and 150. The value of the full range of horizontal shift $\phi$ may be fixed in a machine (given in the machine design specification), or may be modified according to the number of defective nozzles and the size of defective clusters of nozzles. Modification of the full range of horizontal shift may be done manually by the user, or automatically by the controller.

There is more than one way to ensure that the appropriate non-defective sectors receive an increased (e.g., doubled) amount of building material. In one embodiment, the driving voltage of the appropriate non-defective nozzles is increased. In another, more preferred embodiment, the injection rate of the non-defective nozzles is increased. This can be done, for example, by increasing the planar density of the building material droplets (or pixels) dispensed by nozzles that move above defective sectors in a preceding layer.

Figure 12:
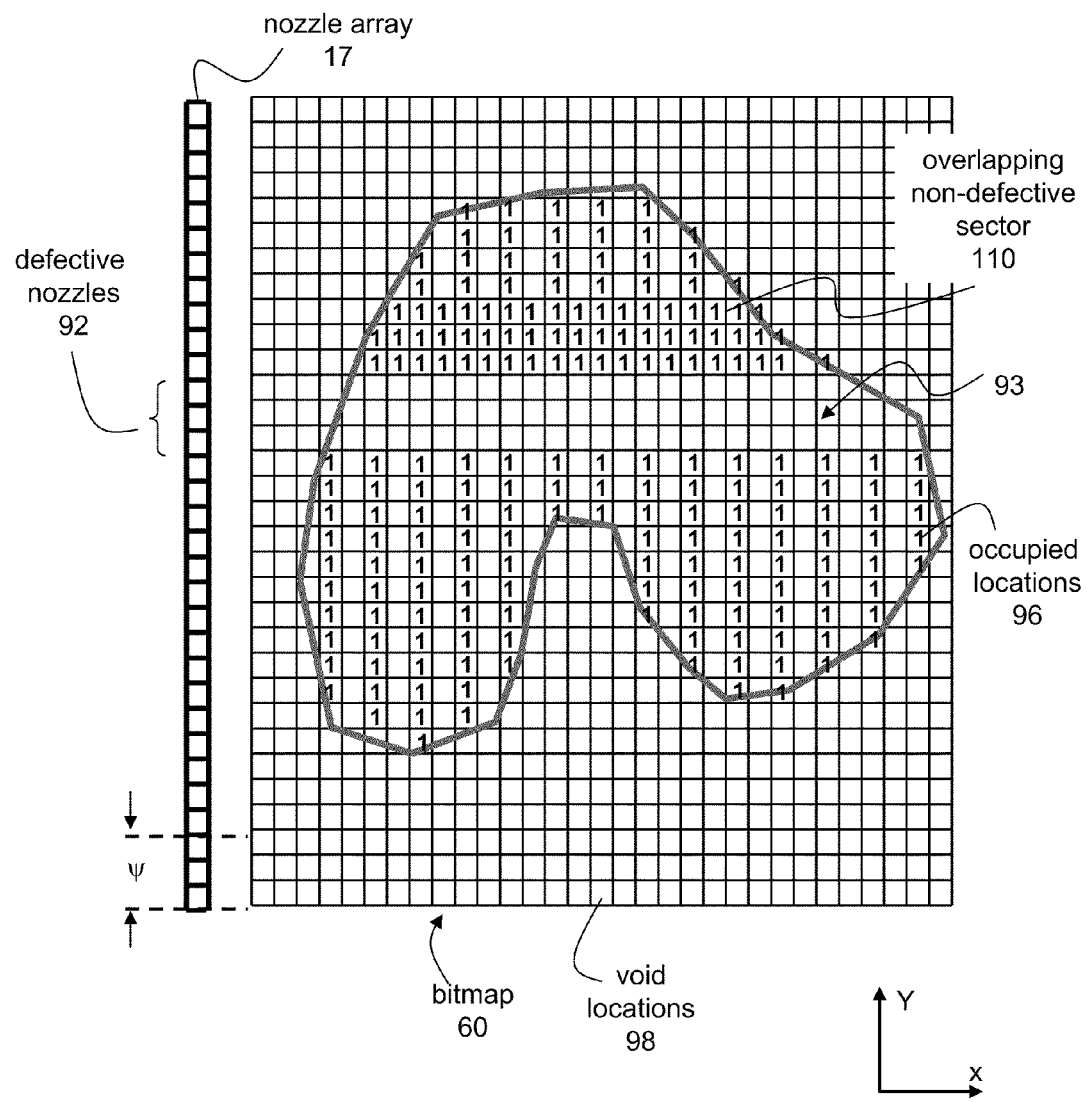
FIG. 12 is a schematic illustration of a procedure for increasing planar density of building material that compensates for dead nozzles in a preceding layer, according to various exemplary embodiments of the present invention.

FIG. 12 is a schematic illustration of a procedure for increasing the planar density of the building material at the overlapping non-defective sectors 110, according to a preferred embodiment of the present invention. Shown in FIG. 12, are nozzle array 17 with defective nozzles 92, occupied locations 96 and the current bitmap 60. The printing head is shifted in Y direction by $\psi$ bitmap elements relative to its location in the previous layer. In the exemplified illustration of FIG. 12, $\psi$=3. As there are 3 adjacent defective nozzles in head 17, the value of $\psi$ ensures that there is no overlap between the defective sector 93 of the current layer and the defective sectors of the previous layer. The latter are overlaid by a non-defective sector 110 of the current layer.

According to a preferred embodiment of the present invention bitmap 60 is preferably prepared in accordance with the shape of the layer, but the planar density of building material in sector 110 is larger than the planar density in the other regions of the layer. In the present exemplary embodiment, every other column in bitmap 60 has "1"s in the bitmap elements of the column (hence corresponds to occupied locations). In contrast, all columns in sector 110 have "1"s in their bitmap elements. As will be appreciated by one ordinarily skilled in the art, such bitmap results in doubling the planar density of building material in sector 110 relative to the other sectors. There is therefore an excess of building material just above the defective sector of the previous layer, which excess of building material percolates to the previous layer and occupies its defective sectors.

When it is desired to dilute selective regions in the layer, e.g., for the purpose of reducing waste and/or providing the layer with the desired thickness and planar resolution, the dilution is preferably performed only in interior regions being scanned by non-defective nozzles. More preferably, the dilution is performed only in regions which are interior regions and for which all target locations are sufficiently far from defective locations of the layer. Typically, there is a distance of at least n target locations along the Y direction between each target location of a diluted region and the nearest defective location of the layer. The parameter n can be any integer larger than 1, e.g., 1<n<10. In addition, the dilution in the locations (or sectors) just above the defective locations (or sectors) in said layer is prevented in the m successive layers, where m is an integer larger than 1, e.g., 1<m<10.

The advantage of the present embodiment is that it allows the handling of defective nozzles by bitmap manipulation without altering the voltage of individual nozzles.

In the embodiment in which the increased amount of building material is provided by increasing the driving voltage of the appropriate non-defective nozzles, it is not necessary to employ bitmap manipulation. In this embodiment, the controller preferably signals the head to increase the volume of jetted droplets of the nozzles which scan rows above the defective sectors in a preceding layer, by increased voltage of the nozzle piezo-electric transducer. Typical volume increase according to this technique is about ×1.2-1.3. Alternatively, the controller preferably signals the head to increase jetting frequency of the respective nozzles (without bitmap manipulation).

The compensation of defective sectors by increasing the dispensing rate can be executed also for sub-layers. If, for example, five adjacent nozzles are defective or non-functional, each or selected X scans of the head can be preceded by a Y shift selected such that the nozzles which scan rows adjacent (in-between or near) to the defective rows of a preceding scan are non-defective, and are operated at increased dispensing rate.

Another technique for handling defective nozzles which can be employed in various exemplary embodiments of the invention is the technique disclosed in U.S. Ser. No. 10/527,907, the contents of which are hereby incorporated by reference.

It is noted that the term "building material", as used herein may include model or "modeling" material, support material, mixed material and/or any suitable combination of materials used in the building, forming, modeling, printing or other construction of three-dimensional objects or models. Building material may include material used to create objects, material used to modify such material (e.g., dye, filler, binder, adhesive etc.), support material or other material used in the creation of objects, whether or not appearing in the final object. The terms "construction" as used herein may include different types and/or combinations of building materials. For example, support constructions may include pillars built from modeling material surrounded by support material. A construction including a single, homogenous material may also be regarded as a construction according to embodiments of the present invention. The term "object" as used herein may include a structure that includes the object or model desired to be built. Such a structure may, for example, include modeling material alone or modeling material with support material. The terms "support" or "support construction" as used herein may include all structures that are constructed outside the area of the object itself. The terms "layer" or "slice" as used herein may include portions of an object and/or accompanying support structures optionally laid one above the other in the vertical (e.g., Z) direction. The word layer may also be used to describe a three-dimensional envelope or skin.

According to various exemplary embodiments of the present invention, the building materials that may be used may be similar to the materials described in the aforementioned patent and patent applications (see, e.g., U.S. Pat. Nos. 6,259,962, 6,569,373, 6,658,314, 7,183,335, 6,850,334, U.S. patent application Ser. Nos. 10/716,426, 10/724,399, 10/725,995, 10/537,458, 11/433,513, 11/518,295 and PCT publication no. WO/2004/096527). For example, photopolymer materials curable by the application of electromagnetic radiation or other materials suitable for three-dimensional object construction may be used. The photopolymer material may be of various types, including, for example, a photopolymer modeling material which may solidify to form a solid layer of material upon curing, and a photopolymer support material which may solidify, wholly or partially, or not solidify upon curing, to provide a viscous material, a soft gel-like or paste-like form and/or a semi-solid form, e.g., that may be easily removed subsequent to printing. The various types of photopolymer material may be dispensed separately or in any given combination, according to the hardness and/or elasticity of the object desired to be formed or any of its parts, or the support constructions required to provide object support during construction. Materials other than those described in the above patents and applications may also be used.

In the embodiments in which the object is formed by the stereolithography technique, the building material is preferably a curable liquid, such as, but not limited to, an ultraviolet curable liquid, capable of absorbing the curing radiation, fast curing and adhering. The curable liquid is preferably non-toxic and of low viscosity. Suitable curable liquid for the present embodiments include, without limitation, mixtures of acrylate compounds with epoxy resins. A process for making ultraviolet curable material is described in U.S. Pat. Nos. 4,100,141 and 5,599,651. Other appropriate curable liquids will occur to those ordinarily skilled in the art for various applications.

In the embodiments in which a combination of powder and binder materials are used, the powder material can be a ceramic powder or a ceramic fiber and the binder material can be inorganic, organic or metallic binder material. Alternatively, a metal powder can be used with a metallic binder or a ceramic binder. Still alternatively, a plastic powder can be used with a solvent binder or a plastic binder, such as, but not limited to, a low viscosity epoxy plastic material. Other appropriate combinations of powder and binder materials will occur to those ordinarily skilled in the art for various applications.

It is expected that during the life of this patent many relevant three-dimensional printing techniques and associated building materials will be developed and the scope of the terms "three-dimensional printing" and "building material" is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of fabricating a three-dimensional object, comprising: forming using a three-dimensional printer a plurality of layers in a configured pattern corresponding to the shape of the three-dimensional object,
   wherein for at least one layer of said plurality of layers, said formation of said layer comprises:
   forming a central region surrounded by a peripheral region, wherein a thickness of said central region is lower than a thickness of said peripheral region, and
   leveling at least said peripheral region by removing material at least from said peripheral region so as to straighten at least said peripheral region.

2. The method of claim 1, wherein said layer is formed so as to ensure a predetermined thickness and predetermined planar resolution.

3. The method of claim 1, wherein formation of said central region comprises leaving vacant locations in said central region to allow building material to flow into said vacant locations.

4. The method of claim 3, wherein said vacant locations are selected so as to reduce the amount of excess building material removed as waste.

5. The method of claim 3, wherein said vacant locations are selected at a bitmap level.

6. The method of claim 5, further comprising:
   preparing a preliminary bitmap according to a predetermined resolution;

calculating an expected thickness of the layer resulting from said preliminary bitmap;

calculating a ratio between said expected thickness and a predetermined thickness of the layer; and based on said ratio, selecting said vacant locations at said preliminary bitmap, thereby preparing a bitmap corresponding to said at least one layer.

7. The method of claim 6, wherein said central region is characterized by a distance from a closest exterior surface of the object which is above a predetermined threshold distance.

8. The method of claim 6, wherein different vacant locations are selected for different layers.

9. The method of claim 8, wherein the variations between selected vacant locations for different layers is random.

10. A method of fabricating a three-dimensional object, comprising: forming using a three-dimensional printer a plurality of layers in a configured pattern corresponding to the shape of the three-dimensional object, wherein for at least one layer of said plurality of layers, said formation of said layer comprises leaving vacant locations in at least one interior region of said layer while allowing building material to flow into said vacant locations, and wherein said at least one interior region is characterized by a distance from a closest exterior surface of the object which is above a predetermined threshold distance of about 2 millimeters.

11. The method of claim 10, wherein said predetermined threshold distance is dependent on the spatial direction from the interior regions to the exterior surface.

12. The method of claim 1, wherein said leveling is prior to solidification of said layer.

13. The method of claim 1, wherein said leveling is by a roller.

14. The method of claim 1, wherein said central region has a diluted spread of material selected such as to reduce a waste ratio of said at least one layer by a factor of at least 2 relative to a waste ratio of said at least one layer in the absence of said dilution.

* * * * *